(12) United States Patent
Venditti

(10) Patent No.: US 9,219,470 B1
(45) Date of Patent: Dec. 22, 2015

(54) SYSTEMS AND METHODS FOR CLOCK PATH SINGLE-ENDED DCD AND SKEW CORRECTION

(71) Applicant: PMC-SIERRA US, INC., Sunnyvale, CA (US)

(72) Inventor: Michael Ben Venditti, Montreal (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 275 days.

(21) Appl. No.: 13/873,817

(22) Filed: Apr. 30, 2013

(51) Int. Cl.
*G06F 1/04* (2006.01)
*G06F 11/00* (2006.01)
*H03K 3/017* (2006.01)

(52) U.S. Cl.
CPC ............................ *H03K 3/017* (2013.01)

(58) Field of Classification Search
CPC ................................. H03K 3/017; H04L 7/00
USPC .................. 713/503; 375/375, 355, 226, 276
See application file for complete search history.

(56) References Cited

U.S. PATENT DOCUMENTS

| | | | |
|---|---|---|---|
| 7,352,204 B2 | 4/2008 | Frisch | |
| 7,423,467 B1 * | 9/2008 | Simon | 327/175 |
| 7,872,494 B2 | 1/2011 | Welker et al. | |
| 8,462,906 B1 * | 6/2013 | Ding | 375/355 |
| 8,779,819 B1 * | 7/2014 | Venditti | 327/170 |
| 2006/0001462 A1 * | 1/2006 | Kim et al. | 327/144 |
| 2006/0203939 A1 * | 9/2006 | Chou et al. | 375/319 |
| 2007/0268407 A1 * | 11/2007 | Rea et al. | 348/572 |
| 2009/0177457 A1 * | 7/2009 | Dai et al. | 703/14 |
| 2010/0295591 A1 * | 11/2010 | Asmanis et al. | 327/276 |
| 2012/0206198 A1 * | 8/2012 | Meninger | 330/69 |
| 2012/0256670 A1 * | 10/2012 | Ding et al. | 327/175 |
| 2013/0229211 A1 * | 9/2013 | Nishiyama et al. | 327/146 |
| 2014/0085123 A1 * | 3/2014 | Roytman et al. | 341/158 |
| 2014/0133529 A1 * | 5/2014 | Ding et al. | 375/219 |

\* cited by examiner

*Primary Examiner* — Vincent Tran
(74) *Attorney, Agent, or Firm* — Dennis R. Haszko

(57) ABSTRACT

A circuit and method for improving signal integrity characteristics of a non-full rate transmitter are disclosed herein. The circuit comprises an actuator block having an input for receiving a differential clock signal, the differential clock signal comprising a positive clock signal and a negative clock signal, the actuator configured to adjust a difference between the positive and negative clock signals; a sensing block, for sensing a difference between positive and negative signals of a differential signal, the differential signal being related to the clock signal; and a calibration block for providing a control signal to the actuator based on the sensed difference between the positive and negative signals.

20 Claims, 27 Drawing Sheets

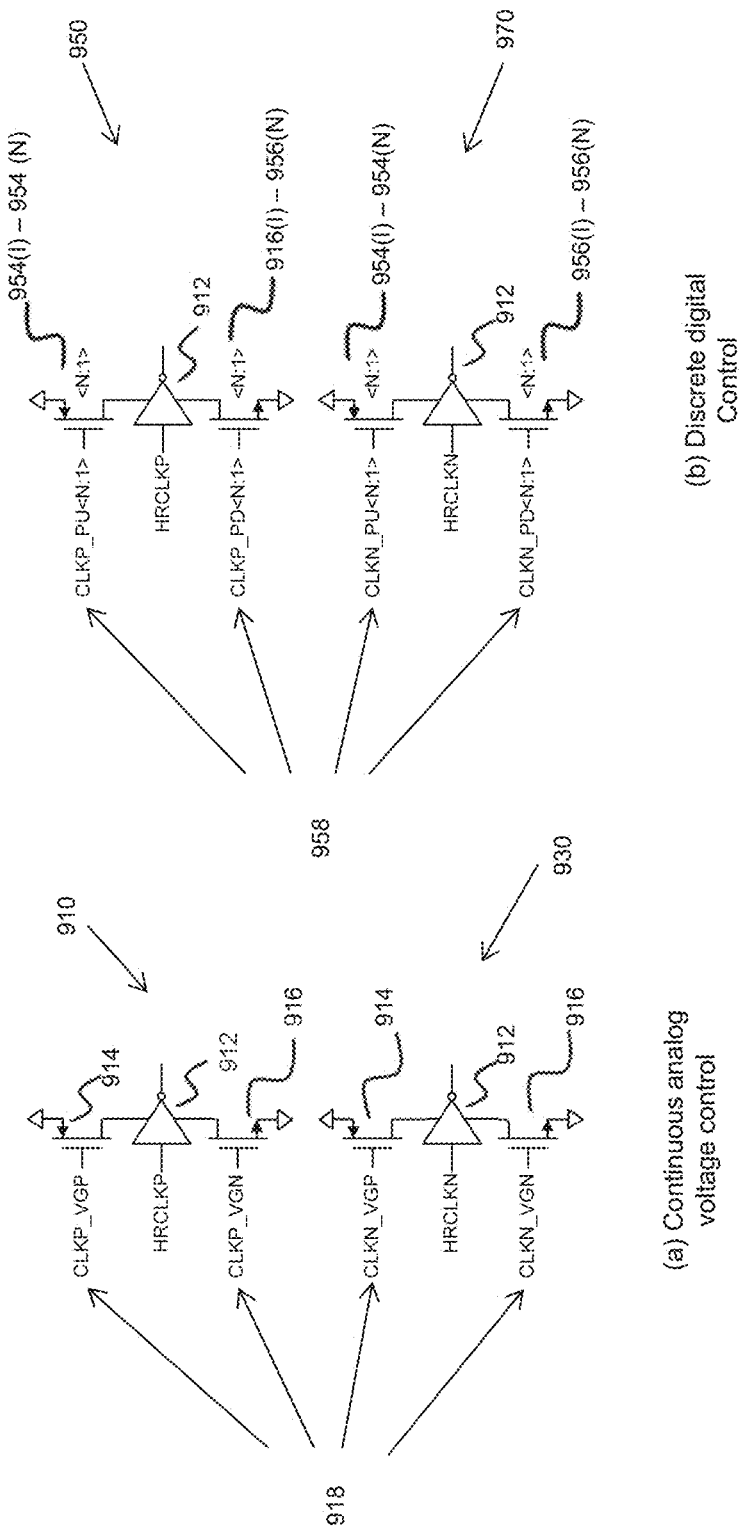

(b) Duty cycle >50%

(a) Duty cycle <50%

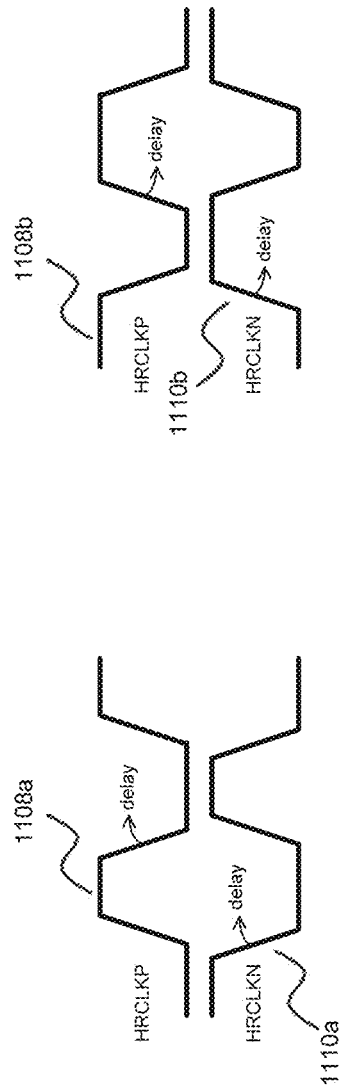
FIGURE 11A (a) Duty cycle <50%
FIGURE 11B (b) Duty cycle >50%

(a) HRCLKP leads HRCLKN (b) HRCLKN leads HRCLKP

SYSTEMS AND METHODS FOR CLOCK PATH SINGLE-ENDED DCD AND SKEW CORRECTION

FIELD

The embodiments described herein are primarily applicable to the field of transmitter/driver designs intended to drive signals off-chip. More particularly, the embodiments described herein relate to system and clock path single ended DCD and skew correction for non-full rate transmitters.

BACKGROUND

In traditional transmit path serialization, the serialization is achieved through a dedicated PISO (parallel-in, serial-out) circuit, and is then followed by the output driver (conventionally referred to as the transmitter).

The PISO circuit employs a mix of sequential and combinational circuit elements to take a parallel input data bus at a lower data rate and produce a serial output signal at a higher data rate. In certain applications, the PISO will also provide additional serial output signals for the transmitter to implement one or more taps of pre- and/or post-cursor emphasis.

The above information is presented as background information only to assist with an understanding of the present disclosure. No determination has been made, and no assertion is made, as to whether any of the above might be applicable as prior art with regard to the present invention.

SUMMARY

In a first aspect, the present disclosure provides a circuit for improving signal integrity characteristics of a non-full rate transmitter, the circuit comprising: an actuator block having an input for receiving a differential clock signal, the differential clock signal comprising a positive clock signal and a negative clock signal, the actuator configured to adjust a difference between the positive and negative clock signals; a sensing block, for sensing a difference between positive and negative signals of a differential signal, the differential signal being related to the clock signal; and a calibration block for providing a control signal to the actuator based on the sensed difference between the positive and negative signals.

In various embodiments, the differential signal comprises a differential clock signal or a differential output signal of the non-full rate transmitter.

In some embodiments, the circuit further comprises a comparison block configured to: digitize the sensed difference between the adjusted positive and negative signals; and provide the digitized sensed difference to the calibration block.

In some embodiments, the sensing block comprises a clock skew sensor, a single ended duty cycle distortion (DCD) sensor, an RC filter, or a DCD-free clock generator.

In various embodiments, the sensing block comprises: a plurality of different types of sensors; and at least one switch for selecting between the plurality of different types of sensors.

In some embodiments, the actuator block is configured to delay transitions of at least one of the positive signal and the negative signal, or advance transitions of at least one of the positive signal and the negative signal, or both. In some embodiments, the actuator block is configured to delay transitions of a leading signal of the differential signal and advance transitions of a lagging signal of the differential signal.

In some embodiments, the actuator block comprises an actuator having a current starved inverter.

In various embodiments, the actuator block comprises a plurality of parallel current starved inverters.

In some embodiments, the current starved inverter comprises an input for receiving an analog control signal or a digital control signal.

In various embodiments, the circuit is configured to correct differential DCD, correct single-ended DCD, correct clock polarity skew, or reduce EMI, or a combination thereof.

In various embodiments, the non-full rate transmitter comprises a half rate transmitter or a quarter rate transmitter.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIGS. 9A and 9B illustrate schematic diagrams of actuators according to various embodiments;

FIGS. 11A and 11B illustrate strategies for correcting single-ended DCD;

DETAILED DESCRIPTION

The embodiments described herein have been shown to be generally agnostic to signaling standard. Some embodiments described herein are targeted for PCI-Express, and SATA/SAS implementations. Various embodiments disclosed herein are also applicable to intra-chip interconnects.

PISOs can be classified by their base architecture, which is a reference to how the final stage of serialization is performed. A full-rate PISO implements a 2:1 serializer using rising edges of a clock that runs at a frequency corresponding to the serialized data rate (e.g. a 12 GHz clock for a 12 Gb/s serial data stream). A half-rate PISO implements a 2:1 serializer utilizing both rising and falling edges of a clock running at a frequency corresponding to half of the serialized data rate (e.g. a 6 GHz clock for a 12 Gb/s serial data stream). A quarter-rate PISO implements a 4:1 serializer utilizing rising and falling edges of two quadrature-spaced clocks running at a frequency corresponding to one quarter of the serialized data rate (e.g. a 3 GHz clock for a 12 Gb/s serial data stream). Additional base PISO architectures may be similarly defined. Many high-speed PISOs utilize a half-rate or quarter-rate base architecture to save power by avoiding the use of clocks running at very high frequencies.

The transmitter takes the PISO output and drives it external to the chip, while providing conventional features to control the output waveform characteristics (e.g. amplitude control, impedance control, edge-rate control, pre-/post-cursor emphasis, etc. . . . ). The fundamental operations of the transmitter are implemented using combinational or analog circuit elements. A voltage-mode transmitter is constructed from conventional CMOS or CMOS-like structures. A current-mode transmitter employs an output stage based on, for example, current-mode logic (CML) or a low-voltage differential signaling (LVDS) structure, and employs pre-driver stages constructed from CML- or LVDS-like structures or from conventional CMOS structures.

For transmit path applications that employ architectures other than full-rate, the effects of clock path duty cycle distortion (DCD) on the performance of the transmitter must be considered.

Figure 1:
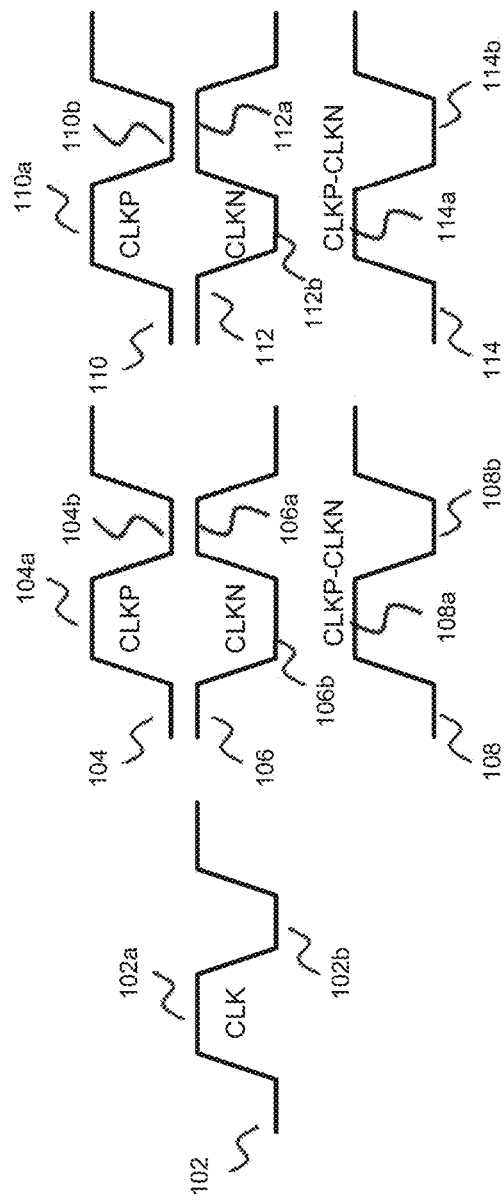
FIGS. 1A to 1C illustrate examples of duty cycle distortion on clock signals.

FIG. 1A illustrates a clock signal 102 that has DCD—in this case, the logic HIGH pulse 102a is wider than the logic LOW pulse 102b.

FIG. 1B illustrates a differential clock pair CLKP 104 and CLKN 106 that each exhibit DCD. CLKP 104 has a wider logic HIGH pulse 104a than logic LOW pulse 104b and CLKN 106 has a wider logic LOW pulse 106b than logic HIGH pulse 106a. The locations of the wider pulses of CLKP and CLKN are coincident such that the differential clock signal CLKP-CLKN 108 exhibits the same DCD characteristics as CLKP 104 (and the inverse of CLKN 106). This is referred to as differential DCD.

FIG. 1C illustrates a differential clock pair CLKP 110 and CLKN 112 that each exhibit DCD—both CLKP 110 and CLKN 112 have a wider logic HIGH pulse (110a and 112a) than logic LOW pulse (110b and 112b). The locations of the wider pulses of CLKP 110 and the narrower pulses of CLKN 112 are coincident (and vice versa) such that the differential clock signal CLKP-CLKN 114 exhibits no apparent DCD characteristics, with each of the logic HIGH pulse 114a and the logic LOW pulse 114b having the same width. This is referred to as single-ended DCD.

Figure 2:
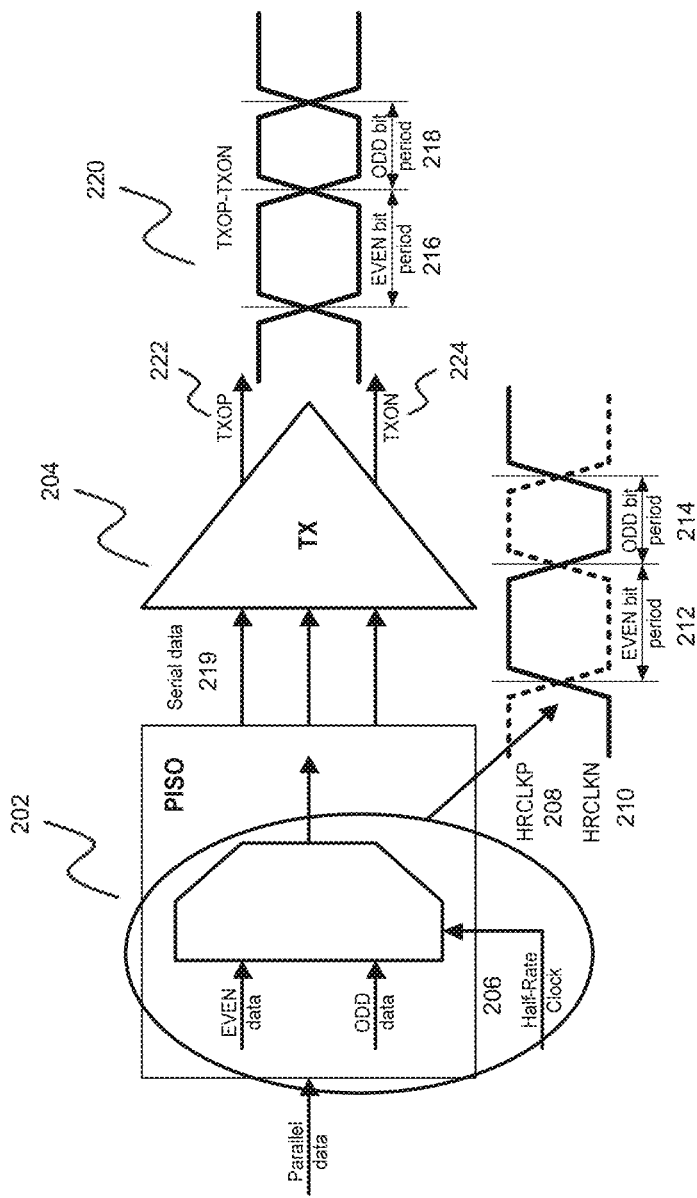
FIG. 2 is a schematic diagram illustrating differential DCD transfer from the clock domain to the data domain.

For transmit path applications that employ a half-rate architecture and employ differential signaling, it is a well-known and typically employed practice to perform closed-loop differential DCD correction on the differential half-rate clock pair. Performing this correction is important, as is illustrated in FIG. 2. FIG. 2 illustrates a PISO 202 coupled to a differential transmitter 204. As illustrated in FIG. 2, the half-rate clock 206 applied to PISO 202 exhibits differential DCD. The half-rate clock 206 comprises signals HRCLKP 208 and HRCLKN 210. Differential DCD on the half-rate clock 206 at the input of the final serializing block will transfer into the data domain by directly affecting the widths of the EVEN 216 and ODD 218 bit periods in the serialized data stream 219. This manifests as jitter on the differential transmitter output 220, which is comprised of the signals TXOP 222 and TXON 224, and this jitter is a direct impairment on the overall jitter performance of a high-speed serial link.

Figure 3:
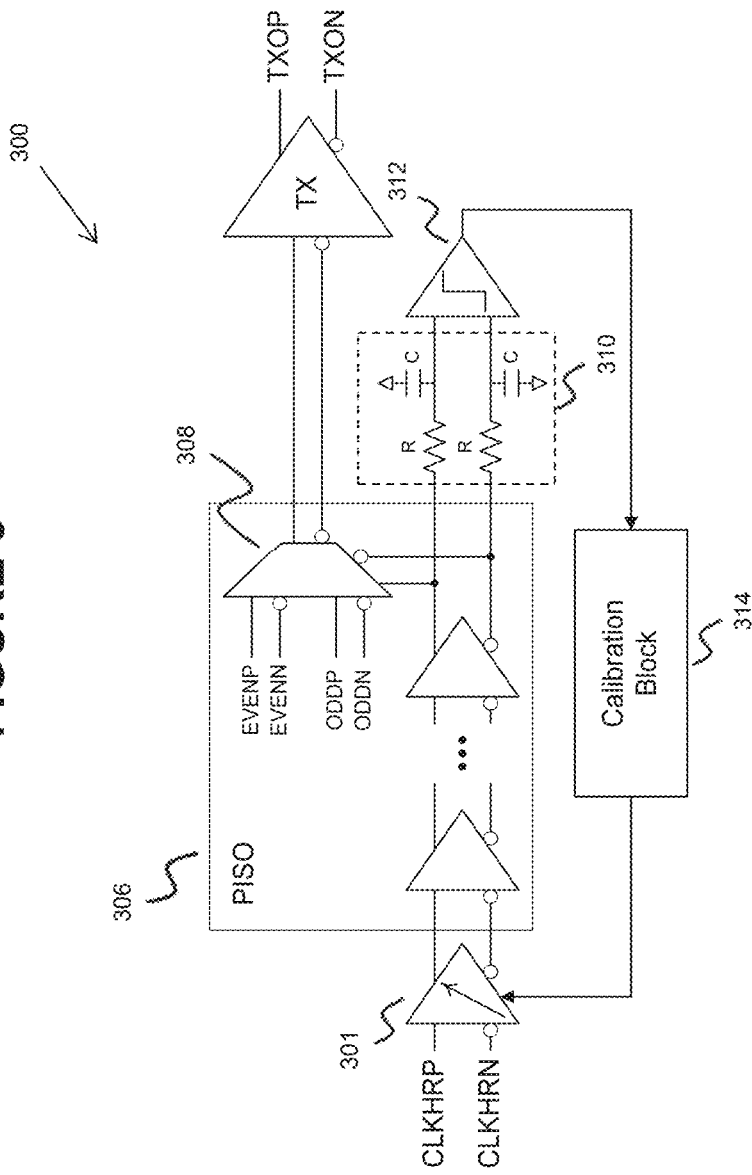
FIG. 3 illustrates a closed loop circuit for correcting differential DCD.

Typically, a closed loop calibration operation is performed to minimize the differential DCD on the half-rate clock path to mitigate the differential jitter impairment. A representative closed-loop approach to correcting differential DCD is illustrated in FIG. 3. FIG. 3 illustrates a circuit 300 that includes an actuator 301 on the half-rate clock path that can adjust the differential DCD on the clock input (which comprises signals CLKHRP 302 and CLKHRN 304) to the PISO 306. At the input of the final 2:1 serializer 308 (shown as a 2:1 multiplexer with the half-rate clock as the path select input), the half rate clock is tapped and sent to an RC filter 310 to measure the average of each clock polarity. These two average values are compared against one another by a comparator 312. A difference detected by the comparator 312 is an indicator of the presence of differential DCD, and the sign of the comparator 312 output indicates whether the differential duty cycle is too small or too big. The comparator 312 output is sent to a calibration block 314 which determines a correction input to the actuator to reduce the differential DCD at the sense point. The correction loop continues until the comparator output is zeroed.

Single-Ended Duty Cycle Correction

Figure 4:
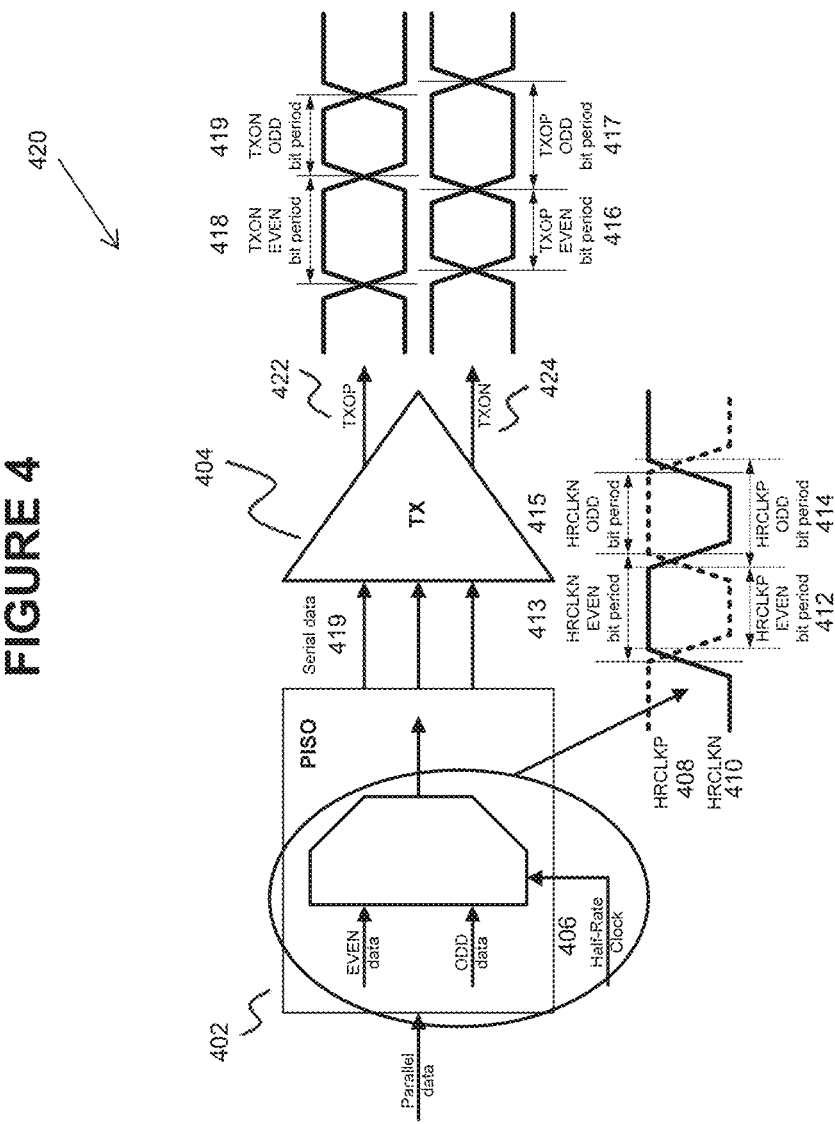
FIG. 4 is a schematic diagram illustrating single-ended DCD transfer from the clock domain to the data domain.

The impact of clock path single-ended DCD on the serialized data stream is somewhat analogous to that of differential DCD as described in section 3, and is illustrated in FIG. 4. Single-ended DCD on the half rate clock 406 will affect the widths of the EVEN and ODD bit periods in each of the serialized data stream polarities. Bit expansions (or shrinkages) of the ODD bits 416 and bit shrinkages (or expansions) of the EVEN bits 417 of the TXOP 422 serial data stream are matched with bit shrinkages (or expansions) of the ODD bits 418 and bit expansions (or shrinkages) of the EVEN bits 419 of the TXON 424 serial data stream. This manifests as jitter on each of the single-ended transmitter outputs. For single-ended signaling applications, this would represent a direct impairment on the overall jitter performance of a high-speed serial link.

Note that the half-rate clock 406 illustrated in FIG. 4 would show no differential DCD, and the same is true for the transmitter output taken differentially. Thus, the presence of clock path single-ended DCD does not necessarily imply differential jitter at the transmitter output or an impairment of the overall jitter performance of a differential high-speed serial link. For this reason, closed-loop clock path calibration in differential transmit path applications traditionally correct for differential DCD as opposed to single-ended DCD.

Figure 5:
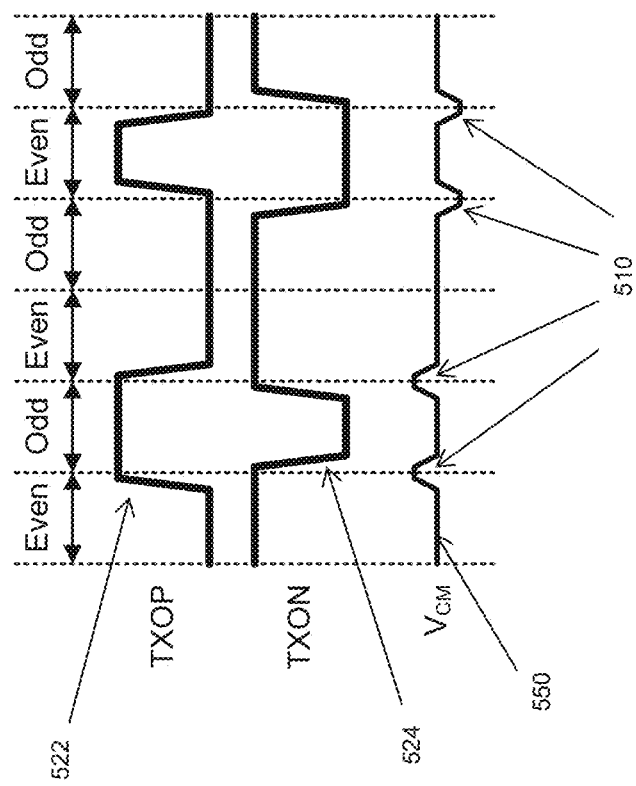
FIG. 5 illustrates single-ended DCD causing common-mode spikes at transmitter output.

Another consequence of clock path single-ended DCD that is transferred onto the serialized data stream is to generate common-mode spikes at the output of the transmitter. This is illustrated in FIG. 5, where the EVEN and ODD bit periods of the transmitter outputs TXOP 522 and TXON 524 are wider or narrow following the situation illustrated in FIG. 4. At every data transition, a spike 510 on the common mode signal VCM 550 is generated, where the direction of the spike is determined by whether the logic transition occurs at EVEN to ODD or ODD to EVEN bit interfaces. These common-mode spikes 510 will have frequency content at the bit rate and are thus a potentially strong source of electromagnetic interference (EMI).

Thus, there would be a desire to minimize or otherwise correct for clock path single-ended DCD in half-rate transmit path architectures which employ either single-ended or differential signaling. In some embodiments, passive design techniques may be employed to limit the degree of single-ended DCD on the half-rate clock that may be experienced over process or random variation and over operating temperature and voltage. In various embodiments, a closed loop correction strategy may be employed to make the single-ended DCD and/or EMI minimization more universally robust.

Polarity Skew Correction

Figure 6:
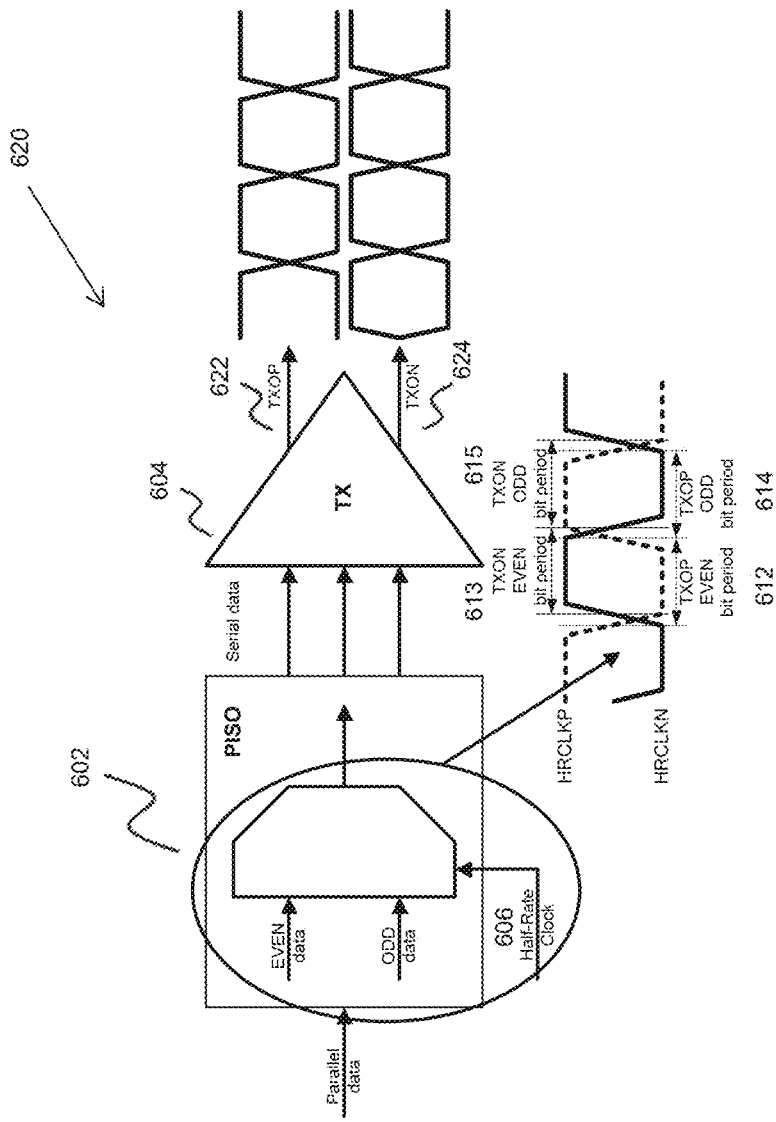
FIG. 6 is a schematic diagram illustrating single-ended skew transfer from the clock domain to the data domain.

The minimization of single-ended DCD for a half-rate transmit architecture may not be sufficient in isolation to optimize single-ended signaling characteristics. There may be, after single-ended DCD correction of the half-rate clock 606, residual skew between the single-ended clock polarities, as illustrated in FIG. 6. This clock polarity skew is transferred onto the serialized data at the transmitter output 620 by partly overlapping the ends of an EVEN or ODD bit period with the beginning of the adjacent ODD or EVEN bit period. This can manifest as inter-symbol interference (ISI) on the single-ended transmitter outputs, and possibly also on the differential transmitter output if the skew is significant. Thus, it may represent impairment of the overall jitter performance of a high-speed serial link.

Figure 7:
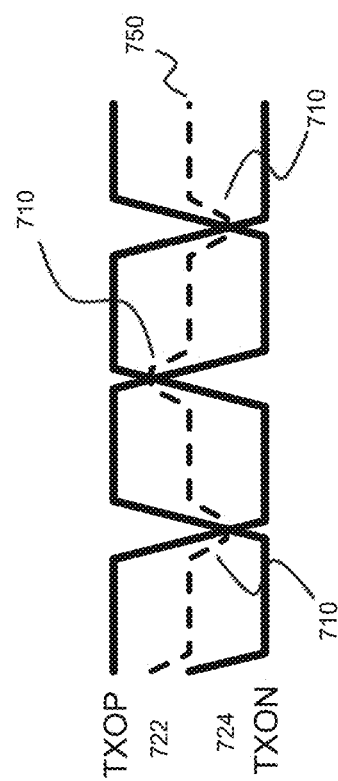
FIG. 7 illustrates a signal plot showing single-ended skew causing common-mode spikes at the transmitter output.

Clock polarity skew causes pairs of transmitter output common-mode spikes 710 in opposite directions, as is illustrated in FIG. 7. FIG. 7 illustrates signals TXOP 722 and TXON 724. This results in spikes 710 in the VCM signal 750. These common-mode spikes 710 have little frequency content at the bit rate and are thus not a primary source of EMI Clock polarity skew may impair the differential serialized data by causing a reduction in the eye diagram opening through the effective slowing of the rise and fall transitions. The combination of effective lower edge rates and common-mode noise makes it more difficult to receive the signal in the far-end receiver.

Thus, there may be an additional desire to minimize or otherwise correct skew on the single-ended clock polarities (in addition to single-ended duty cycle) in half-rate transmit path architectures. A closed loop correction strategy may be employed to minimize the skew.

Contributions to EMI at Transmitter Output

Figure 8:
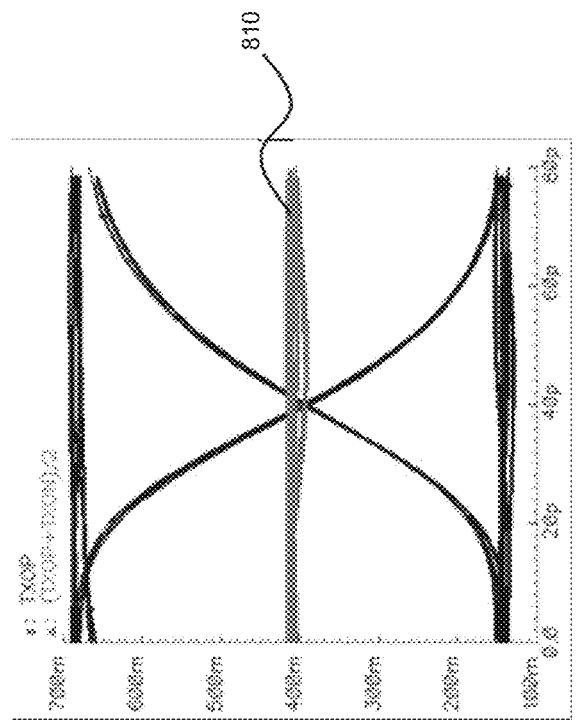
FIG. 8 illustrates a simulated wave form showing a common mode spike.

The EMI present at the output of the transmitter is easily represented by spikes on the common-mode signal (TXOP+TXON)/2 arising from data transitions. This is illustrated in FIG. 8, which shows a simulated common-mode noise waveform (TXOP+TXON)/2 810 for a transmitter superimposed on an eye diagram of one of the single-ended output polarities (TXOP).

One of the simplest ways to infer EMI at the output of a transmitter is to compare the average of the transient common-mode signal against the static common-mode level (when no data is being transmitted). When no data is being transmitted, the output common-mode is determined only by the static characteristics of the transmitter's output driver.

When real data is output from the transmitter, a number of transient effects will cause the average transient common-mode to deviate from the static common-mode. Some of these transient effects include:

- Rise and fall time mismatch originating in the transmitter's output driver
- Systematic error in the location of rising edges relative to falling edges originating in the data path of the transmitter
- Systematic error in the EVEN and ODD data bit widths on each single-ended transmitter output originating from single-ended DCD on the PISO clock in a half rate transmit architecture When one or more of these transient effects are present, spikes in the transient common-mode signal will tend to be in a fixed direction (negative-going or positive-going spikes), with an analogous effect on the average transient common-mode level (smaller than the DC level for negative-going spikes, larger than the DC level for positive-going spikes). A common-mode spike at each clock transition event in a fixed direction has strong frequency content at the bit rate. Thus, comparing the average transient common-mode level against the DC common-mode level can infer the strength of EMI that is present at the bit rate.

It thus can be advantageous to make use of actuators that directly influence one or more of these transient effects in conjunction with a sensor that compares the average transient common-mode level to the DC common-mode level for the purposes of reducing EMI at the transmitter output.

Conversely, other transient effects, such as skew in the complementary polarities of the data being transmitted, can cause common-mode spikes in both directions (both positive- and negative-going spikes). Depending on the degree of symmetry in the positive- and negative-going common-mode spikes, these effects have a moderate or minor impact on the average transient common-mode level and on EMI generation. Additionally, their presence cannot be easily inferred by comparing the average transient common-mode level to the DC common-mode level.

Single-Ended Clock DCD Correction

This disclosure describes a method and apparatus to adjust the single-ended duty cycle of the clock at the final serializing stage of a PISO used in a high-speed transmitter for the purposes of improving high-speed signaling characteristics and to reduce EMI. In some embodiments, it is intended as a companion method to differential duty cycle correction. In some such embodiments, it is assumed that differential duty cycle is corrected, leaving single-ended DCD to be corrected afterward. Differential DCD correction is generally a precursor step to single-ended DCD correction because the presence of differential DCD tends to compromise attempts to sense the presence of single-ended DCD.

In some embodiments, the method and apparatus for single-ended DCD correction includes a closed-loop calibration system including the actuation apparatus in the clock path, a sensing means at a desirable location along the clock path to measure the degree of single-ended DCD on the clock, and a calibration block operating on the sensor output to devise correction control inputs to the actuator to adjust the single-ended DCD in the desired manner.

Various embodiments described herein include an actuation apparatus that includes a pair of current-starved inverters (one for each polarity of the clock) with control of the pull-up path current source and the pull-down current source in each current-starved inverter. This permits an effective widening or narrowing of either the high or low periods of each clock polarity.

The sensing means of some embodiments described in this disclosure measures the average value of a clock signal or the average value of the output of a single-ended duty-cycle sensing circuit, and compares the result against a reference voltage using a comparator. When a clock signal has perfect single-ended duty cycle, its average value is typically close to one half of the supply voltage VDD. In that sensing application, the reference voltage could be VDD/2, or it may be set to another voltage [via a digital to analog converter (DAC), for example] to compensate for other effects such as leakage, random offsets, etc. Alternatively, the reference voltage can be generated by averaging a clock signal with a known duty cycle. When a duty-cycle sensing circuit is employed, the reference voltage can be generated by sending a clock signal with good duty cycle to a replica of the duty-cycle sensing circuit, and averaging its output. The output of the sensing means is a signal that indicates if the clock has a too-low duty cycle ("1" pulses narrower than "0" pulses) or a too-high duty cycle ("1" pulses wider than "0" pulses). The sensor would be made to operate on one or both clock polarities.

In various embodiments described herein, the calibration block takes the output(s) of the sensing means and determines an appropriate control signal modification to the actuation apparatus. The control signal modification serves to adjust the degree of starving in the current-starved inverter to adjust the duty cycle to minimize the DCD.

Clock Polarity Skew Correction

This disclosure describes various embodiments of a method and apparatus to adjust the skew in clock polarities at the final serializing stage of a PISO used in a high-speed transmitter for the purposes of improving high-speed signaling characteristics and to reduce EMI. It is intended as a companion method to single-ended duty cycle correction. It is assumed that single-ended duty cycle is corrected at the final serializing stage of the PISO, possibly leaving only skew between the clock polarities.

In various embodiments, the actuation apparatus may be the same type as that used for single-ended DCD adjustment (either the same instance, or an additional instance of the actuator). In some embodiments, a sensing means is provided to directly measure the degree of skew between the clock polarities. The sensor output is sent to a calibration block, which determines an appropriate control signal modification to the actuation apparatus.

Single-Ended Clock DCD Adjustment to Assist in EMI Reduction

This disclosure further describes various embodiments of a modified DCD adjustment method to assist in the reduction in EMI at the transmitter output. Some such embodiments utilize the same actuation apparatus as described above, but relocate the sensing means to operate on the outputs of the transmitter in a manner describe above in the section discussing DCD and skew correction above as well as the present discussion regarding EMI correction.

In various embodiments, the sensing means measures the average value of a quantity related to the transmitter output signals TXOP and TXON. This could be, for example, the average of the common-mode signal (TXOP+TXON)/2, or the average of TXOP and/or TXON separately. The measured average quantity or quantities are then compared against a reference voltage using a comparator.

In some embodiments, the reference voltage could be the static common-mode level of the transmitter. In a conventional voltage mode transmitter, this might be equal to half of the supply voltage, or equal to some other appropriate reference voltage to compensate for other effects such as leakage, random offsets, etc. In various embodiments, the output of the sensing means is a signal that indicates if the averaged quantity measured by the sensor is above or below the reference voltage.

In various embodiments, the calibration block then takes the digitized output(s) of the sensing means and determines an appropriate control signal modification to the actuation apparatus. The control signal modification serves to adjust the degree of starving in the current-starved inverter to reduce the error in the difference between the averaged quantity measured by the sensor and the reference voltage.

Clock Path Single-Ended DCD and Skew Correction for Half-Rate Transmitters

Sources of DCD and Skew

In a conventional high-speed serial transmit link, the transmitter (PISO plus output driver) is accompanied by a clock synthesis block, such as a phase-locked loop (PLL), that is the source of the clock for the PISO. Depending on the application, the clock synthesis block may be relatively close (hundreds of microns) to the transmitter or it may be located quite far (hundreds of microns to multiple millimeters) from it. In any of these arrangements, one typically finds a number of common elements, including the clock synthesizer, one or more frequency dividers, and a number of clock buffers/repeaters.

In any given integrated circuit realization and operation of the serial transmit link, there will be a number of sources that contribute to DCD. Random variations will result in threshold voltage variation for the transistors in the circuits along the clock path. Such variation typically results in the accumulation of differential DCD along the clock path. The physical design implementation may also possess unintended systematic mismatch on clock routes which would also introduce single-ended DCD and/or clock polarity skew.

More globally, the circuitry in the clock path is usually designed around a set of transistor models which represent the typical semiconductor process characteristics, and designed for a nominal supply voltage and operating temperature. In practice, transistors in a given fabricated circuit may exhibit gross characteristics that deviate from the typical process characteristics and may operate at voltages and temperatures that differ from the nominal assumptions. These effects tend to cause deviations in the degree of rise and fall time matching and low-to-high and high-to-low propagation delay for elements along the clock path. These effects tend to result in single-ended DCD and skew between the complementary polarities of the clock.

Transfer of DCD and Skew from Half-Rate Clock to Serialized Data

In half-rate transmitter architectures, differential and single-ended DCD and clock polarity skew transfer onto the data at the final 2:1 serialization stage of the PISO. The transfer of differential DCD onto data is illustrated in FIG. 2. The EVEN bit periods 212 on both polarities of the half rate clock 206 (HRCLKP 208 and HRCLKN 210) match each other, as do the ODD bit periods 214. However, the EVEN bit periods 212 do not match the ODD bit periods 214, and this will be propagated to the output of the final 2:1 serialization stage of PISO 202 and to the output 220 of the transmitter 204. The resulting DCD will be seen on the differential transmitter output 220 and appear as jitter. This DCD transfer does not directly result in significant EMI at the transmitter output.

The transfer of single-ended DCD onto data is illustrated in FIG. 4. The EVEN bit period 412 width on the positive half-rate clock polarity (HRCLKP 408) matches the ODD bit period 415 width on the negative half-rate clock polarity (HRCLKN 410). Similarly, the ODD bit period 414 width on HRCLKP 408 matches the EVEN bit period 413 width on HRCLKN 410. However, the two sets of bit period widths do not match each other, and this will be propagated to output of the final 2:1 serializer of PISO 402 and to the output 420 of the transmitter 404. The resulting DCD will be seen on each of the single-ended transmitter outputs 422 and 424 and appear as single-ended jitter. Depending on the severity of the DCD, there may be little or no manifestation on the differential transmitter output 420. This DCD transfer results in potentially significant EMI at the transmitter output.

The transfer of clock polarity skew onto data is illustrated in FIG. 6. All of the EVEN (612 and 613) and ODD (614 and 615) bit period widths on HRCLKP 608 and HRCLKN 610 match each other, but the temporal location of the beginning and end of the bit periods on HRCLKP 608 and HRCLKN 610 are skewed relative to each other, and this will be propagated to output of the final 2:1 serializer of PISO 602 and to the output 620 of the transmitter 604. The resulting skew will be seen between the two polarities of the single-ended transmitter outputs 622 and 624, and possibly manifest as differential edge rate degradation, common-mode noise, and ISI. This transfer of skew results in relatively little EMI content at the data bit rate at the transmitter output; it is spread over the frequency spectrum of the signal.

DCD/Skew Adjustment Actuator

A simple and commonly found implementation for an actuator that can be used to address any/all of differential DCD, single-ended DCD, or polarity skew is based on a current-starved inverter, as illustrated in FIGS. 9A and 9B. FIG. 9A shows lumped transistor (914 and 916) implementations for the tail sources of the inverter 912, with continuous analog control voltages 918 that may, for example, be set by a DAC or an analog filter. FIG. 9B shows a discrete control strategy that employs N tail transistors (954(1) to 954(N) and 956(1) to 956(N)) with discrete digital control busses 958. The set of tail transistors may be of identical size (thermometer control code), they may be binary weighted (binary control code), or some combination/variation thereof.

The set of four control signals (referring equally to the analog control voltages or the digital control signals) CLKP_VGP, CLKP_VGN, CLKN_VGP, and CLKN_VGN, can be manipulated differently to adjust the differential duty cycle of HRCLKP-HRCLKN, the single-ended duty cycle of HRCLKP and HRCLKN, or the skew between HRCLKP and HRCLKN.

Figures 10A, 10B:
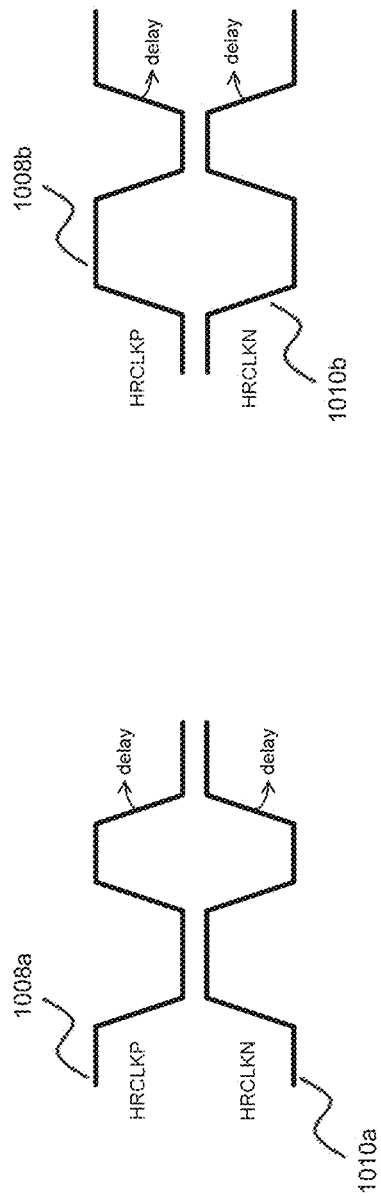
FIGS. 10A and 10B illustrate strategies for correcting differential DCD.

A strategy to correct differential DCD is illustrated in FIGS. 10A and 10B. FIG. 10A shows an example whereby HRCLKP 1008a and HRCLKN 1010a exhibit differential duty cycle less than 50% (a differential 'high' pulse width is narrower than a differential low' pulse width). To correct this differential DCD, the falling edge of HRCLKP 1008a and the rising edge of HRCLKN 1010a are both delayed to broaden the differential 'high' pulse. This corresponds to adjusting CLKP_VGN and CLKN_VGP in FIGS. 9A and 9B to starve the corresponding tail sources in the actuator, which slow down the desired transitions, effectively retarding their crossing points. Upon restoration of normal transition times by a subsequent buffer stage, the 'high' pulse width of the differential clock will be widened.

FIG. 10B shows the analogous situation whereby HRCLKP 1008b and HRCLKN 1010b exhibit differential duty cycle greater than 50% (a differential 'high' pulse width is wider than a differential low' pulse width). To correct this differential DCD, the rising edge of HRCLKP 1008b and the falling edge of HRCLKN 1010b are both delayed to broaden the differential low' pulse. This corresponds to adjusting CLKP_VGP and CLKN_VGN in FIGS. 9A and 9B to starve the corresponding tail sources in the actuator, which slow down the desired transitions.

A strategy to correct single-ended DCD in the absence of differential DCD is illustrated in FIGS. 11A and 11B. FIG. 11A shows an example whereby both HRCLKP 1108a and HRCLKN 1110a exhibit single-ended duty cycle less than 50% ('high' pulse width narrower than 'low' pulse width) To correct this single-ended DCD, the falling edges of both HRCLKP 1108a and HRCLKN 1110a are delayed. This corresponds to adjusting CLKP_VGN and CLKN_VGN in FIGS. 9A and 9B to starve the corresponding tail sources in the actuator, which slow down the desired transitions.

FIG. 11B shows the analogous situation whereby both HRCLKP 1108b and HRCLKN 1110b exhibit single-ended duty cycle greater than 50% ('high' pulse width wider than 'low' pulse width) To correct this single-ended DCD, the rising edges of both HRCLKP 1108b and HRCLKN 1110b are delayed. This corresponds to adjusting CLKP_VGP and CLKN_VGP in FIGS. 9A and 9B to starve the corresponding tail sources in the actuator, which slow down the desired transitions.

Figures 12A, 12B:
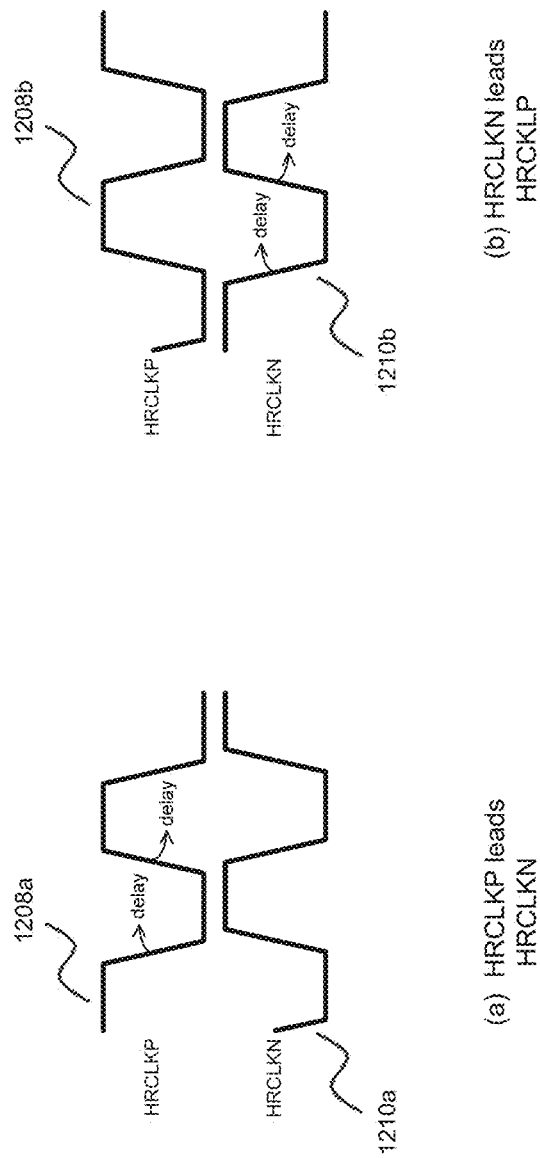
FIGS. 12A and 12B illustrate strategies for correcting clock polarity skew.

A strategy to correct clock polarity skew in the absence of either differential or single-ended DCD is illustrated in FIGS. 12A and 12B. FIG. 12A shows an example whereby HRCLKP 1208a leads HRCLKN 1210a (rising/falling transitions of HRCLKP 1208a occur earlier in time than the corresponding falling/rising transitions of HRCLKN 1210a). To correct this skew, the rising and falling edges of HRCLKP 1208a are both delayed. This corresponds to adjusting CLKP_VGP and CLKP_VGN in FIGS. 9A and 9B to starve the corresponding tail sources in the actuator, which slow down the desired transitions.

FIG. 12B shows the analogous situation whereby HRCLKN 1210b leads HRCLKP 1208b (rising/falling transitions of HRCLKN 1210b occur earlier in time than the corresponding falling/rising transitions of HRCLKP 1208b). To correct this skew, the rising and falling edges of HRCLKN 1210b are both delayed. This corresponds to adjusting CLKN_VGP and CLKN_VGN in FIGS. 9A and 9B to starve the corresponding tail sources in the actuator, which slow down the desired transitions.

Some of the embodiments discussed thus far in relation to correcting duty cycle or skew have focused on delaying the required transitions of the clocks by starving (making weaker) the appropriate tail source(s) in the actuator. It would be equally possible to operate the actuator such that its tail sources could also be made stronger, to permit advancing selected transitions.

As was mentioned for some embodiments of the actuator described above, the process of delaying selected transitions on HRCLKP and HRCLKN consisted of slowing down the transition by starving the appropriate tail current sources in the actuator. This has the effect of delaying the location of desired crossing points. The normal transition times in the buffer chain are restored (and effective duty cycle or polarity skew adjusted) by subsequent buffer stages.

An alternative actuator structure that can achieve equivalent functionality to that described above is illustrated in FIG. 13. This alternate actuator employs a two stage design, where the first stage 1302a and 1302b (current-starved inverters) is used to achieve effective delay in selected transitions, and the second stage 1304a and 1304b (an inverter with separate pmos and nmos device inputs, each driven by a separate current-starved inverter) restores normal transition times.

Two approaches to controlling the actuator of FIG. 13 will be discussed for illustration purposes. Suppose, for example, it is desired to delay the rising edges of HRCLKP. This can be achieved by adjusting both CLKP_PU_VGP and CLKP_PU_VGN to starve the inverter 1312*a* in the pull-up path of the HRCLKP actuator, slowing down both its rising and falling edges. This serves to delay the signal present on the pmos device 1314*a* of the second stage 1304*a* of the HRCLKP actuator 1301*a*, which will result in a delayed rising edge.

A functionally equivalent approach to delaying the rising edges of HRCLKP would be to adjust CLKP_PU_VGN and CLKP_PD_VGN, which slow down the falling edges of the inverters in the pull-up and pull-down paths of the HRCLKP actuator 1301*a*. This serves to delay the falling edges of the signal present at the pmos 1314*a* and nmos 1313*a* devices of the second stage 1304*a* of the HRCLKP actuator 1301*a*. This causes a delayed rising edge at the output of the actuator because the pmos device 1314*a* responds primarily to falling edges. It does not result in a materially changed falling edge at the output of the actuator 1301*a* because the nmos device 1313*a* sets the location of falling edges in response to rising edges at its input. In such a control arrangement, it would be possible to merge VGP controls (e.g. CLKP_PU_VGP and CLKP_PD_VGP merged into CLKP_VGP) and VGN controls (e.g. CLKP_PU_VGN and CLKP_PD_VGN merged into CLKP_VGN) and simplify the actuator implementation, as is illustrated in FIG. 14.

Figure 13:
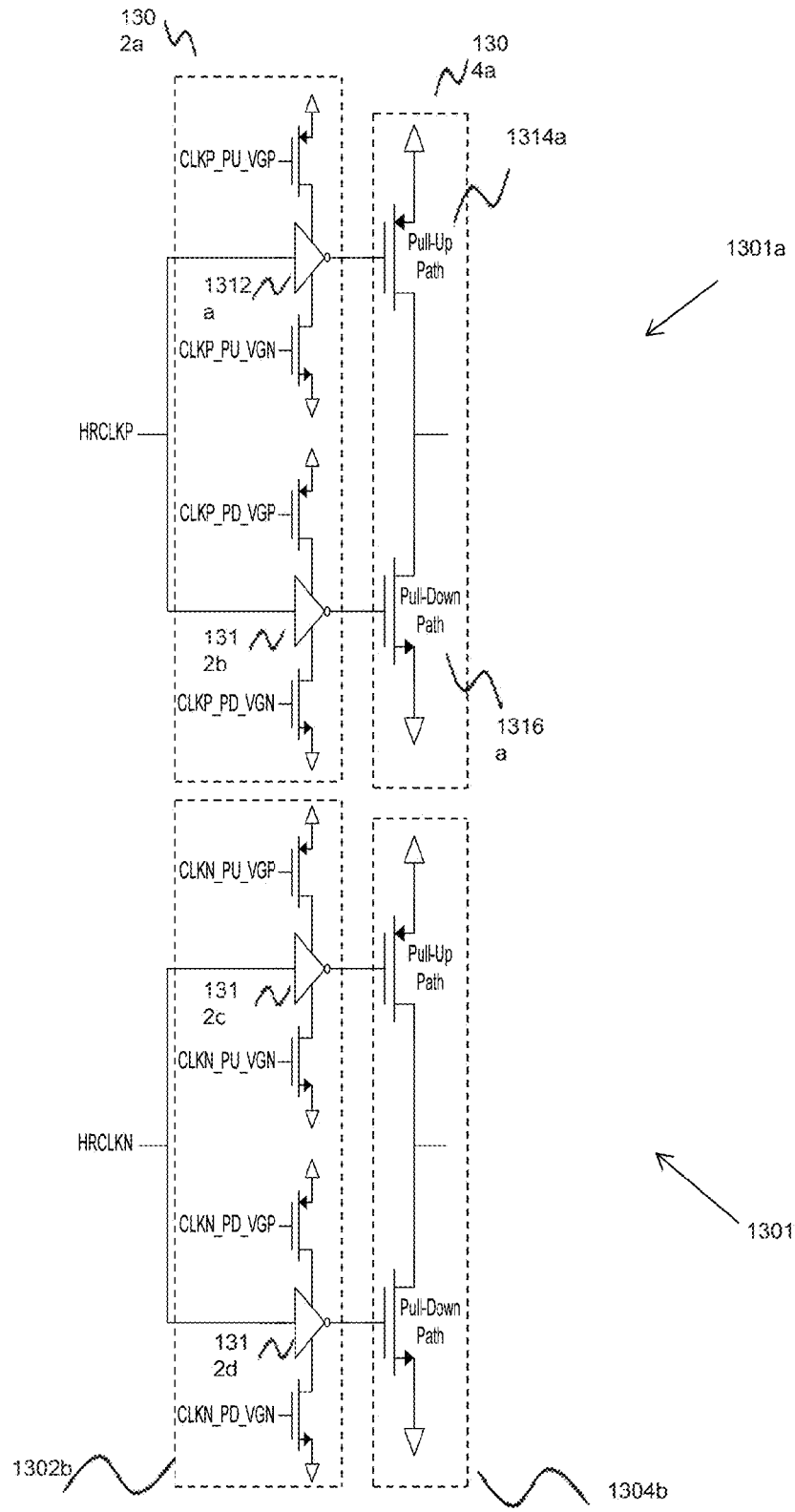
FIG. 13 illustrates a schematic diagram of an actuator according to various embodiments.
Figure 14:
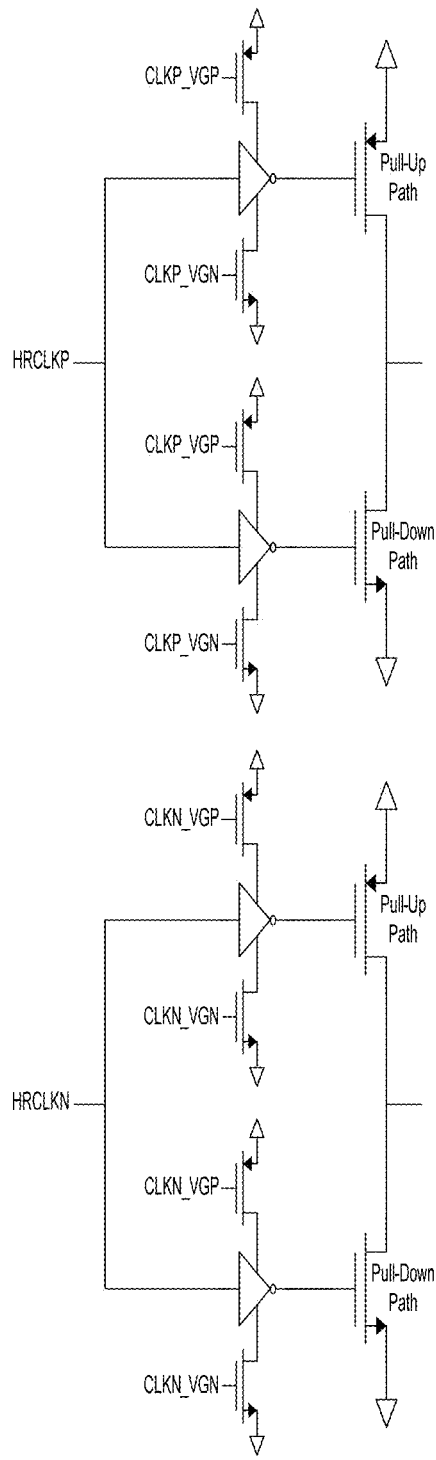
FIG. 14 illustrates a schematic diagram of actuator according to various embodiments.

The overall strategies described above to correct for differential DCD, single-ended DCD or clock polarity skew would remain the same for the actuators of FIG. 13 and FIG. 14 through direct adaptation of the required adjustments to the control voltages.

As mentioned above for the actuator of FIG. 9, it would be equally possible to implement the alternate actuators described in this section with discrete digital controls instead of continuous analog voltage controls. It would additionally be possible to operate the alternate actuator such that its tail sources could also be made stronger to permit advancing selected transitions.

Single-Ended DCD Sensing
Direct Clock Signal Averaging

It was explained above that, for differential duty-cycle correction, differential DCD sensing can be achieved by measuring the average value of each clock polarity (e.g. via an RC filter) and comparing them to one another.

Figure 15B:
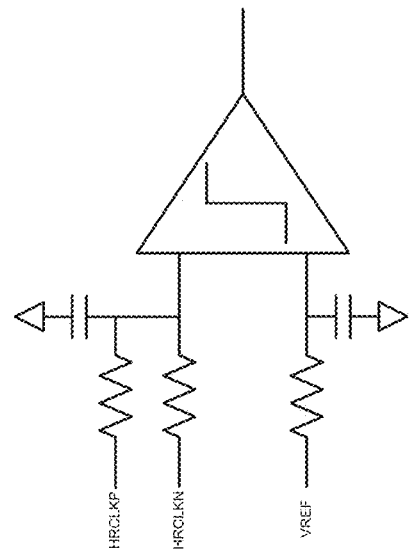
FIGS. 15A and 15B illustrates circuits for sensing single-ended DCD.
Figure 15A:
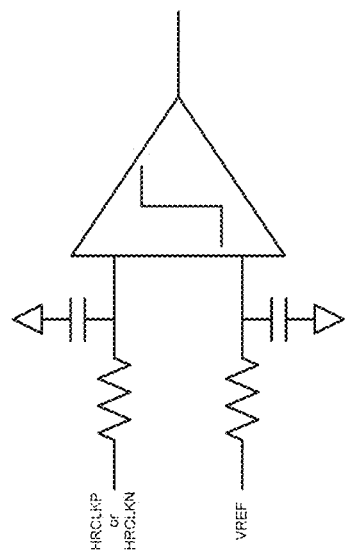

This approach can be adapted to sense single-ended DCD, as illustrated in FIGS. 15A and 15B. In FIG. 15A, the average value of one of the clock polarities is compared to a reference voltage. In FIG. 15B, the average value of the superposition of both clock polarities is compared to a reference voltage.

Figure 16:
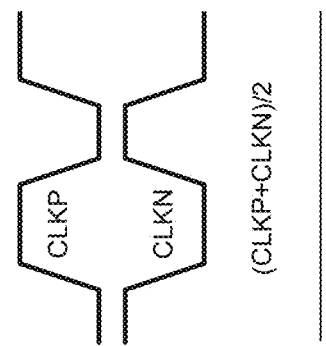
FIG. 16 illustrates a common mode signal for clock with differential DCD.
Figure 19:
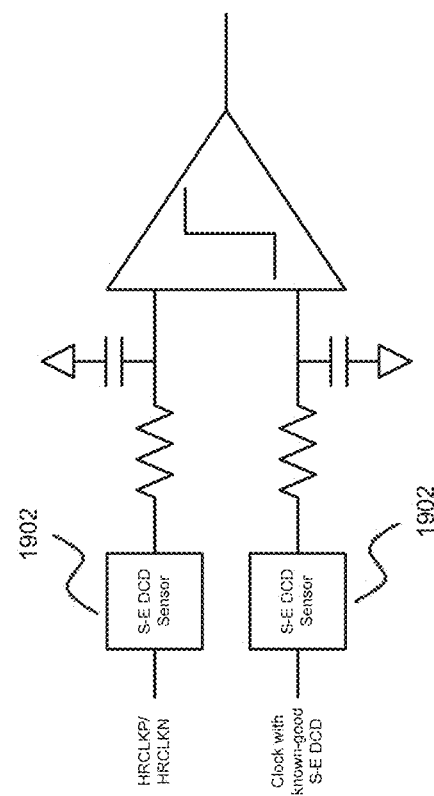
FIG. 19 illustrates a single-ended DCD sensor implementation.

Note that the presence of differential DCD on the clock polarities may compromise the attempt to sense the presence of single-ended DCD. With reference to FIG. 16, if there is differential DCD, there are equal and opposite amounts of DCD on the single-ended polarities. In this case, averaging the superposition of the two clocks will provide the same value as that of a pair of clocks with no single-ended DCD. Furthermore, if the average of one clock polarity is taken, it will indicate that single-ended DCD is present, but the application of the single-ended DCD correction procedure described above will produce undesirable results. If the average of CLKP in FIG. 19 is taken, it will indicate the presence of too-high duty cycle. The single-ended DCD correction procedure described above in relation to FIGS. 9 to 12 will cause rising edges of both CLKP and CLKN to be delayed. This will improve the duty cycle of CLKP, but make the duty cycle of CLKN worse. For this reason, single-ended DCD sensing operations should assume that some form of differential DCD correction has been applied beforehand.

When a clock signal has perfect single-ended duty cycle, its average value is typically close to one half of the supply voltage, though this will vary as a function of process, operating voltage, operating temperature, leakage, random mismatch, and circuit dynamics (e.g. overshoot or undershoot during transitions). To accommodate for this, a programmable reference voltage may be generated by a resistor divider or more generally by a DAC, for example.

Figure 17:
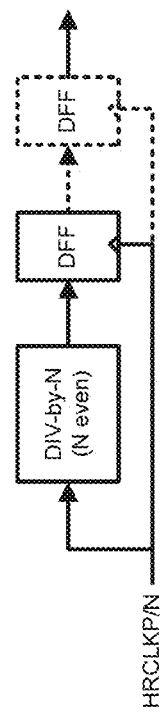
FIG. 17 is a block diagram illustrating a circuit for generating a clock with a good duty cycle.

Alternatively, the reference voltage can be generated from a clock signal with a known-good duty cycle. Such a clock may be generated from an arbitrary clock of a given frequency by using a frequency divide-by-N circuit (where N is preferentially an even integer, and even more preferentially N=2), followed by one or more D-flip-flops clocked by the original clock, as illustrated in FIG. 17. The average value of the output of this circuit can be used as the reference voltage.

Single-Ended Duty Cycle Sensor

Figure 18:
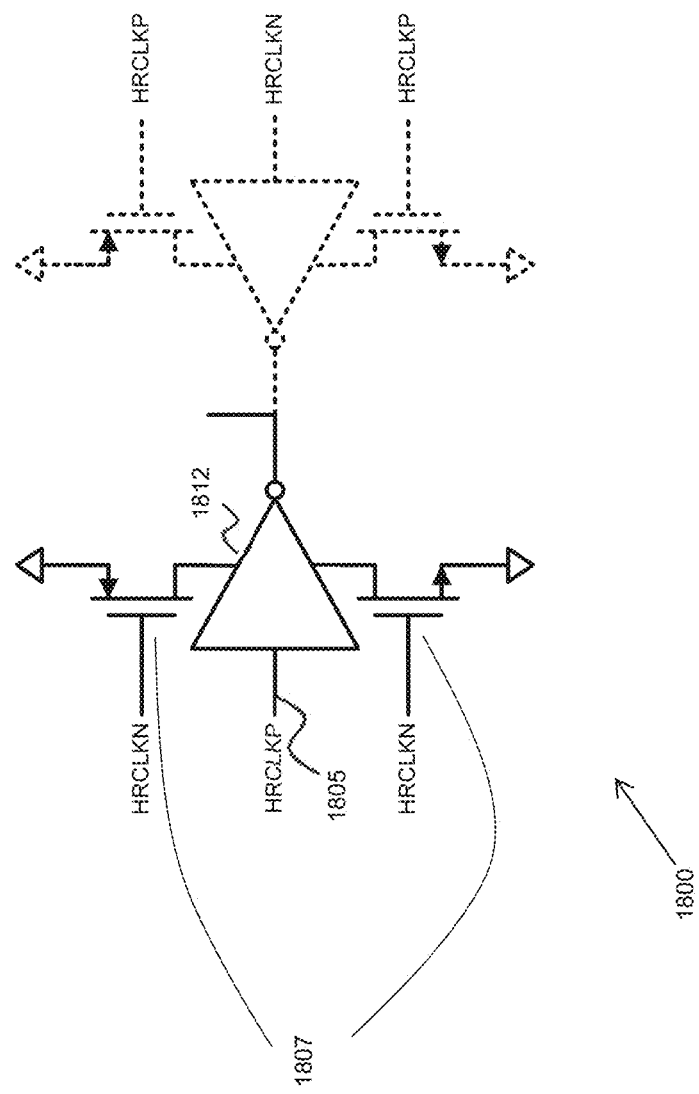
FIG. 18 illustrates a single-ended DCD sensor.

A sensing circuit that can detect single-ended DCD on the half-rate clock is illustrated in FIG. 18. The basic element of the sensor is a current-starved inverter 1812, with the inverter input 1805 connected to one of the half-rate clock polarities, and the current-starving controls 1807 are connected to the complementary half-rate clock polarity. As illustrated in FIG. 18 by dashed lines, two basic elements with complementary input connections and with shorted outputs may optionally be employed to improve the symmetry of the sensor response in detecting both too-high (high pulses narrower than low pulses) and too-low (low pulses narrower than high pulses) duty cycle.

When there is no single-ended DCD the sensor produces a nominal average output voltage from pull-up operations (via the pmos paths) and pull-down (via the nmos paths) operations, which are occurring at the same time. When there is too-low duty-cycle, both the inverter input and the current-starving controls spend more time below an inverter threshold, which favours pull-up path operations over pull-down operations. The average sensor output is thus pulled to a relatively higher voltage than the case where there is no single-ended DCD. Conversely, when there is too-high duty-cycle, both the inverter input and the current-starving controls spend more time above an inverter threshold, which favours pull-down path operations over pull-up operations. The average sensor output is thus pulled to a relatively lower voltage than the case where there is no single-ended DCD.

The output of the single-ended DCD sensor would then be averaged (e.g. by an RC Filter) and sent to the input of a comparator. To generate the reference voltage of the comparator, an additional instance of the single-ended DCD sensor can be used operating from a clock with a known-good single-ended duty cycle, which can be generated from the half-rate clock in a manner analogous to the method used in FIG. 20. The overall sensing strategy is illustrated in FIG. 19, where S-E DCD Sensor 1902 can be, for example, sensor 1800 of FIG. 18.

Note again that the presence of differential DCD on the clock polarities may compromise the attempt to sense the presence of single-ended DCD. For example, if the differential clock has DCD, there are equal and opposite amounts of single-ended DCD on the single-ended polarities. In this case, rising and falling edges of opposing polarities will largely be lined up in time. Applying this clock pair to the single-ended DCD sensor will produce an output signal equivalent to a pair of clocks with no single-ended DCD present. Thus, the single-ended DCD correction procedure described above in relation to FIGS. 9 to 12 will not be applied.

Conversely, given that the single-ended DCD sensor is not directly sensitive to the presence of differential DCD, it will help ensure that the actuation operations to correct differential DCD will not interfere with correction operations for single-ended DCD other than to make the loop work better.

Skew Sensing

A skew sensor provides a measure of the relative locations of the falling edges of one clock polarity and the rising edges of the complementary polarity (and vice versa). A simplified representative clock skew sensor circuit element is illustrated in FIG. 20A. The circuit of FIG. 20A can be used to sense when CLKP rising edges occur earlier than CKLN falling edges. More specifically, this circuit element can be used to sense the relative location of rising edges of the positive polarity CLKP to falling edges of the negative polarity CLKN. When CLKP is 'low' and CLKN is 'high', the circuit element is in a pre-charge state, with the pmos 2008 device enabled, the tail nmos device 2004 enabled, and the bridging nmos device 2006 disabled. This holds the output node (OUT) at the supply (VDD). When CLKP transitions 'high' and CLKN transitions 'low', there is an overlapping period of time in which the pmos device pulls OUT toward VDD, and the discharge path to ground (VSS) via the series nmos devices pulls OUT toward VSS. The earlier that CLKP rising edges occur relative to CLKN falling edges, the more that OUT will be pulled toward VSS. Conversely, when CLKN falling edges occur earlier than CLKP rising edges, OUT will tend to remain close to VDD. Thus, the skew sensor element is optimal for sensing skew primarily in one direction (degree by which CLKP rising edge is early with respect to CLKN falling edge).

Figure 20B:
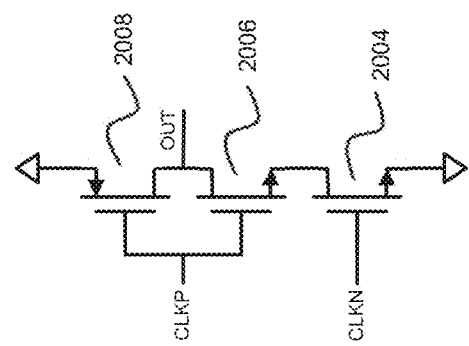
FIGS. 20A and 20B illustrate skew sensing elements.
Figure 20A:
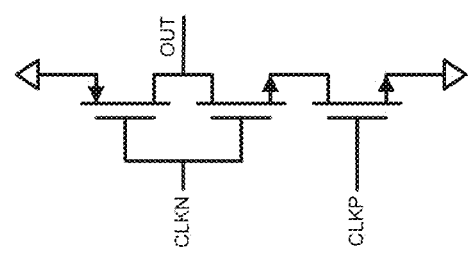

The same skew sensor element can be used with swapped clock inputs to measure the relative locations of the falling edges of CLKP to the rising edges of CLKN, as shown in FIG. 20B. The circuit of FIG. 20B can be used to sense when CLKN rising edges occur earlier than CLKP falling edges. In this arrangement, the earlier that CLKN rising edges occur relative to CLKP falling edges, the more that OUT will be pulled toward VSS. Conversely, when CLKP falling edges occur earlier than CLKN rising edges, OUT will tend to remain close to VDD.

When the two input clock polarities CLKP and CLKN have perfect single-ended duty cycle, then any skew on one clock polarity will skew its rising edges relative to the falling edges of the other polarity, and vice versa. For example, if there is skew such that rising edges of CLKP are early with respect to falling edges of CLKN, and there is no DCD on either CLKP or CLKN, then the falling edges of CLKP will be early with respect to the rising edges of CLKN by the same amount. This situation will be sensed strongly by the circuit of FIG. 20A, and not by the circuit of FIG. 20B.

Conversely if there is skew such that rising edges of CLKN are early with respect to falling edges of CLKP, and there is no DCD on either CLKP or CLKN, then the falling edges of CLKN will be early with respect to the rising edges of CLKP by the same amount. This situation will be sensed strongly by the circuit of FIG. 20B, and not by the circuit of FIG. 20A. Comparing the output of the two skew sensor circuit elements of FIGS. 20A and 20B to each other is therefore an effective approach to sensing positive or negative skew between two complementary clock polarities.

Note that the presence of differential DCD on the clock polarities may compromise the attempt to sense the presence of polarity skew. For example, if the differential clock has DCD, there are equal and opposite amounts of DCD on the single-ended polarities. In this case, rising and falling edges of opposing polarities will largely be lined up in time. Applying this clock pair to the skew sensor will produce an output signal equivalent to a pair of clocks with no DCD present. Thus, the skew correction procedure described above in relation to FIGS. 9 to 12 would not be applied.

Conversely, given that the clock skew sensor is directly sensitive to the presence of differential DCD, it will help ensure that the actuation operations to correct differential DCD will not interfere with correction operations for clock skew other than to make the loop work better.

Figure 21B:
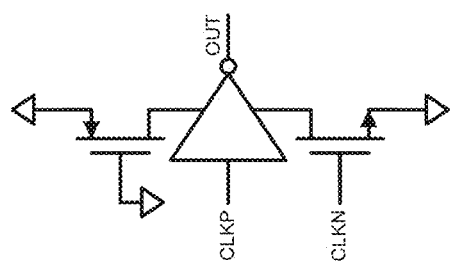
FIGS. 21A and 21B illustrate skew sensing elements.
Figure 21A:
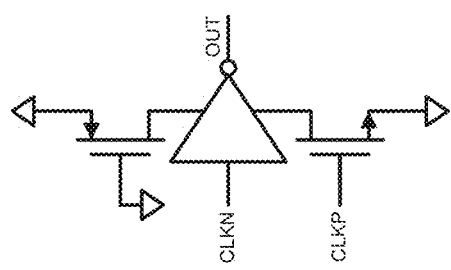

Alternative embodiments of the skew sensor elements presented in FIGS. 23A and 23B are shown in FIGS. 21A and 21B. In some instances, the embodiments of FIGS. 21A and 21B may be preferred over those of 23A and 23B. The use of symmetric current-starved inverter structures can be preferential, as it facilitates the matching in strength of the pull-up and pull-down paths of the skew sensor elements.

The circuit of FIG. 21A can be used to sense when CLKP rising edges occur earlier than CLKN falling edges. The circuit of FIG. 21B can be used to sense when CLKN rising edges occur earlier than CLKP falling edges.

Figure 22A:
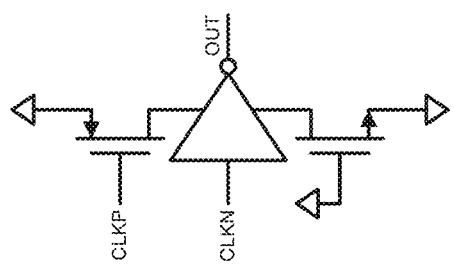
FIGS. 22A and 22B illustrate skew sensing elements.
Figure 22B:
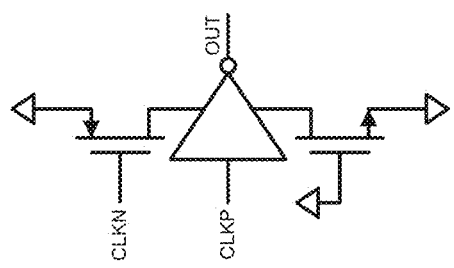

The complementary circuit elements to those presented in FIGS. 21A and 21B can also be realized to detect relative skew between clock transitions. They are presented in FIGS. 22A and 22B. Consider the skew sensor circuit element illustrated in FIG. 22A. Analogous to the skew sensor circuit element of FIG. 21A, this circuit element can be used to sense the relative location of rising edges of CLKP to falling edges of CLKN. In other words, it can be sued to sense when CLKP rising edges occur earlier than CLKN falling edges. Similarly, the skew sensor circuit element illustrated in FIG. 22B can be used analogously to the skew sensor circuit element of FIG. 21B to sense the relative location of falling edges of CLKP to the rising edges of CLKN. In other words, it can be used to sense when CLKN rising edges occur earlier than CLKP falling edges.

Figure 23:
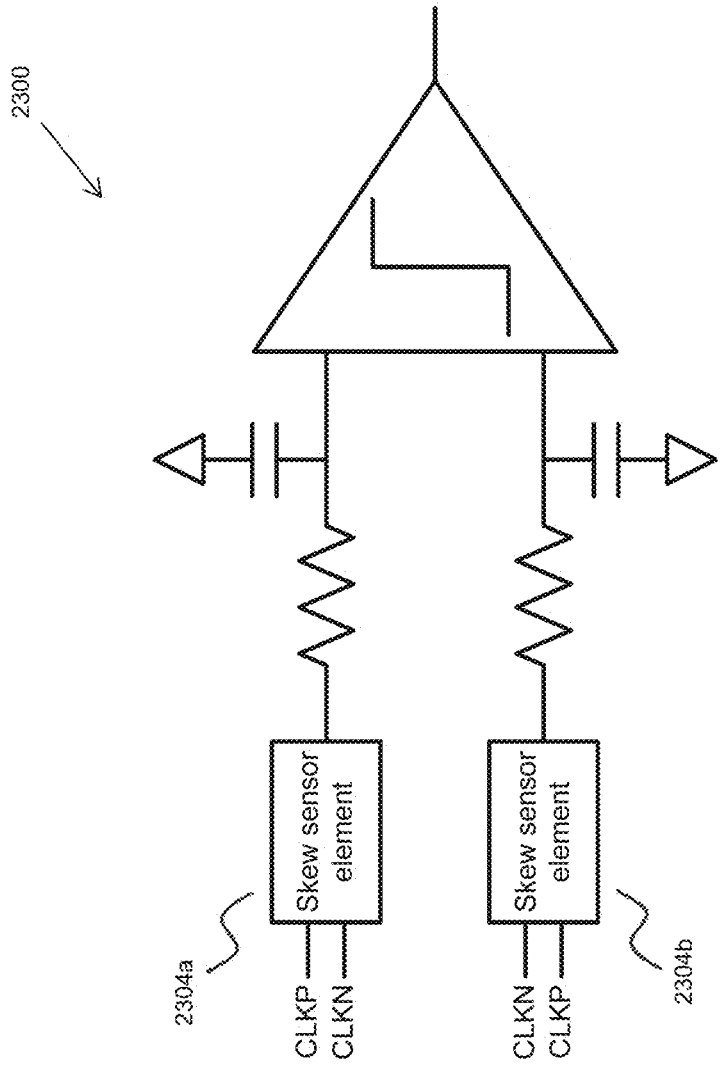
FIG. 23 illustrates a skew sensor.

FIG. 23 illustrates a complete skew sensor 2300 where the outputs of the skew sensor circuit elements are averaged (via RC filters) and sent to a comparator for comparison against one another. Skew sensor 2300 includes sensing circuits 2304*a* and 2304*b*. Sensing circuit 2304*a* and 2304*b* can be any suitable sensing circuits including, for example, the sensing circuits illustrated in FIGS. 21A, 21B, 22A and 22B. However, in order for meaningful results to be achieved, both sensing circuits 2304*a* and 2304*b* should be of the same type of implementation. For example, sensing circuit 2304*a* could be the sensing circuit of FIG. 21A and sensing circuit 2304*b* could be the sensing circuit of FIG. 21B. Alternatively, For example, sensing circuit 2304*a* could be the sensing circuit of FIG. 22A and sensing circuit 2304*b* could be the sensing circuit of FIG. 22B.

Closed-Loop Clock Path Single-Ended DCD and Polarity Skew Correction

For differential serial transmit applications that employ half-rate PISO architectures, correction of differential DCD on the half-rate clock is paramount to ensure minimal jitter impairment on the transmitted data. An approach to correcting differential DCD via calibration in closed-loop was described above.

The added benefit of correcting single-ended DCD and clock polarity skew is in maintaining optimal single-ended characteristics of the transmitter output, including minimizing single-ended jitter/ISI and reducing EMI.

As was described in relation to FIGS. 17 to 23, it would be preferable to correct differential DCD in advance of or in addition to the correction of single-ended DCD or polarity skew.

Closed-Loop Overview

Figure 24:
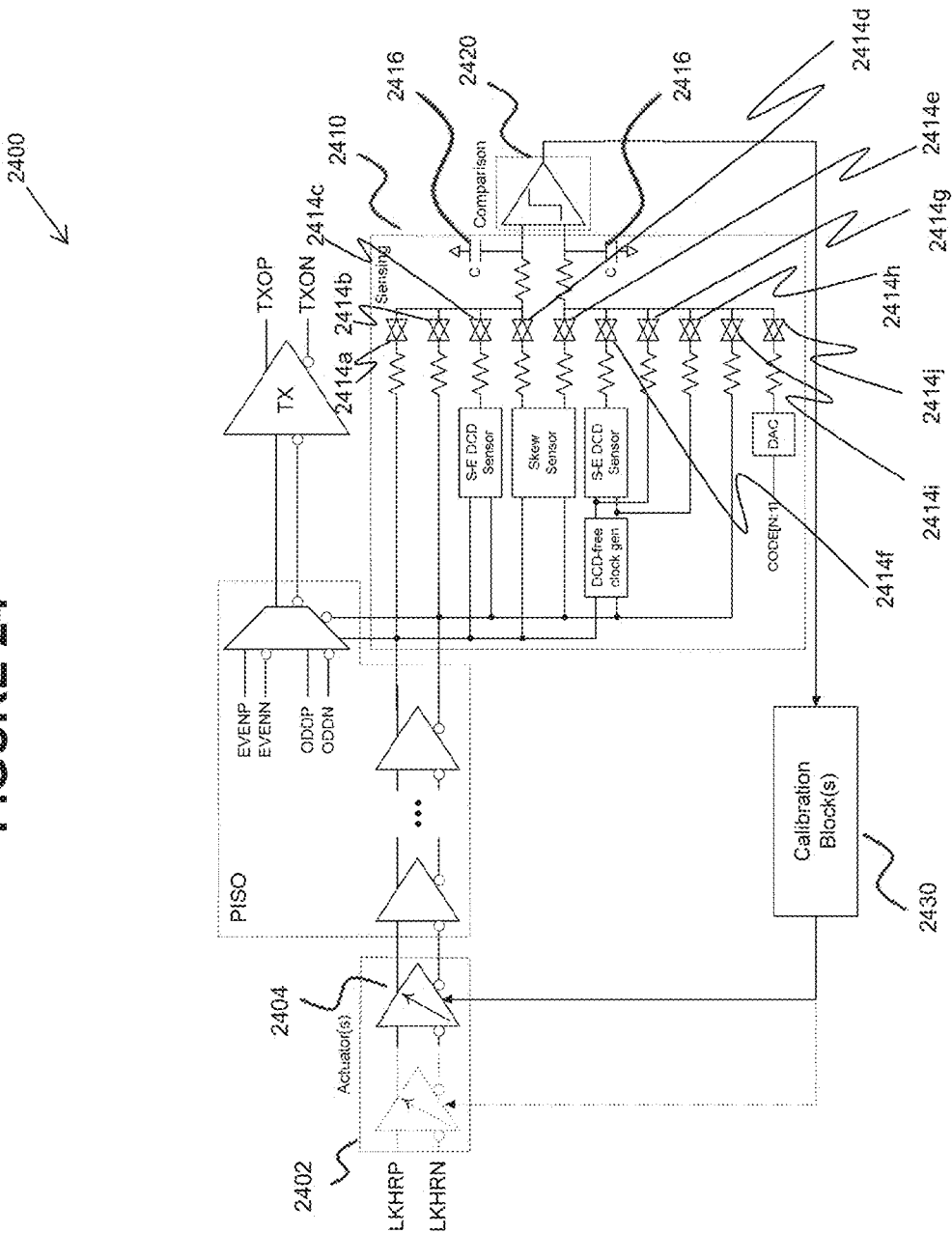
FIG. 24 illustrates a closed-loop single-ended DCD and skew correction circuit.

Reference is now made to FIG. 24, which is a block diagram illustrating a circuit 2400 with closed-loop single-ended DCD and skew correction. A closed-loop procedure by which the differential DCD, single-ended DCD and polarity skew along the clock path can be reduced has a number of components: an actuator block 2404 used to adjust the differential and single-ended duty cycle of and to adjust the skew between the clock polarities, sensors 242414 to measure the degree of differential and single-ended DCD and to measure the skew between the clock polarities, one or more comparison stages 2420 to digitize the output of the sensors, and one or more calibration blocks 2430 that determine corrective input stimuli for the actuators 2402.

A representative actuator has been described above. FIG. 24 illustrates the potential for multiple independent actuators 2404 (e.g. separate actuators 2404 to adjust differential duty-cycle, single-ended duty cycle and polarity skew). The actual number of actuators 2404 used can vary between embodiments. In various embodiments, the number of actuators used is any number greater than 1. In some embodiments, a single actuator 2404 is used to perform all of the corrections.

The sensor block 2410 of FIG. 24 includes a number of different sensors. Other embodiments include different number of sensor elements and can, for example, include a single sensor or a subset of the sensors illustrated in sensor block 2410 of FIG. 24. The sensor block illustrated in FIG. 24 is capable of performing a number of different sense operations, depending on how it is configured. The inputs to the sensor block are the two polarities of the half rate clock, with the sense point being at the clock input of the final serialization stage of the PISO.

There are a number of different realizations possible for the sensing block. The embodiment illustrated in FIG. 24 can be attractive for situations where hardware reuse is desirable, as the capacitors 2416 used for the various RC filters is shared, as is the digitization block that follows. If desired, duplicating certain circuitry could enable parallel sensing/digitization operations for differential and single-ended duty cycle and polarity skew.

The sensor block 2410 illustrated in FIG. 24 can be configured for a number of different operations by enabling different paths to the inputs of the digitization block by for example enabling or disabling the various transmission gates 2414.

To sense differential DCD by measuring the average value of each clock polarity, transmission gates 2414a and 2414i would be enabled.

To sense single-ended DCD by measuring the average value of one of the clock polarities, transmission gate 2414a or 2414b would be enabled.

To sense single-ended DCD by measuring the average value of the superposition of the clock polarities, both transmission gates 2414a and 2414b would be enabled. On the reference side, transmission gate 2414g or 2414h would be enabled to generate a reference voltage by averaging one of the outputs of a DCD-free clock generation block as described in section 6.2.5. Similarly, both transmission gates 2414g and 2414h could be enabled to generate a reference voltage by averaging the superposition of both outputs of a DCD-free clock generation block. Alternatively, the reference voltage can be obtained from an N-bit programmable DAC by enabling transmission gate 2414j.

To sense single-ended DCD by using the sensor circuit described in section 6.2.5, transmission gate 2414c would be enabled. On the reference side, transmission gate 2414f would be enabled, which takes the output of the replica single-ended DCD sensor operating from the outputs of the DCD-free clock generation block as described in section 6.2.5.

To sense polarity skew, transmission gates 2414d and 2414e would be enabled to connect the outputs of the skew sensor described in section 6.2.6 to the inputs of the digitization block.

The comparison block 2420 performs a comparison operation between its inputs and outputs a signal indicating which input is larger than the other. In some embodiments, comparison block 2420 could be an analog comparator. In other embodiments, such as for example, in a digitally-assisted closed-loop implementation, the comparator could be followed by some form of limiting amplifier (e.g. a clocked sense-amplifier with regenerative feedback) to amplify the analog comparator output to signal voltage levels corresponding to standard digital logic circuitry "1" or "0". Alternatively, the output of the comparator could be used in an analog closed-loop implementation or in a mixed analog/digital implementation.

The calibration block 2430 takes the output from the comparison block as its input. Calibration block 2430 devises an appropriate control signal change for the actuator(s) 2404 that serve to reduce the detected differential or single-ended DCD or to reduce the detected polarity skew on the half-rate clock. In some embodiments, the calibration block is a digital state machine.

FIG. 24 provisions for a number of different configurations involving the calibration block 2430. A single comparison block 2420 is shown, with different configurations available to sense differential and single-ended DCD and polarity skew. Portions of the sensing block 2410 and comparison block 2420 can be duplicated (e.g. one set for differential DCD sensing, another for single-ended DCD sensing and another for polarity skew sensing) to provide multiple signals to the calibration block 2430. Conversely, the sensing block 2410 and comparison block 2420 could have its configuration alternate between operating from differential DCD, single-ended DCD, and polarity skew sense information, sequentially producing correction signals for the respective actuator(s). Finally, there may be multiple physical calibration blocks, each customized for interfacing with an actuator that is intended to perform one function (i.e. differential or single-ended DCD adjustment or polarity skew adjustment). Alternatively, a more complex calibration block could be devised to perform more than one (possibly all) closed-loop correction operations while interfacing with a single actuator.

In various embodiments, the sensors in the sensing block 2410 are operating on a non-full-rate clock signal (e.g. a half-rate clock signal) which must be available in order for the PISO to function. Thus, calibration can be done at any time—at system power-up, periodically in scheduled transmitter downtime intervals, or during normal transmitter operation. By operating on clock signals, there is no concern regarding pattern-dependent drift in the averaging operations being performed by the sensors.

One potential source of error in performing the closed-loop calibration operation described herein is that, in some embodiments, there may be mismatch in rise and fall time and the presence of overshoot and/or undershoot during transitions due to process variation and voltage or temperature conditions. These effects can have an influence on the sensing operation and potentially result in a systematic measurement error. Additionally, blocks such as the DCD-free clock generation block, the single-ended DCD sensor, the skew sensor, and the comparison block will suffer from random mismatch and operational impairments in extreme process conditions and in extreme operating voltage and temperature conditions which may impair their ability to function as intended.

EMI Sensing at Transmitter Output

As described above, the presence of single-ended DCD on the clock in a half-rate transmit architecture will be transferred onto the data domain of the serialized data by modulating the EVEN and ODD bit periods appearing on the transmitter output polarities. This will result in impairments of the single-ended transmitted waveforms and spikes on the common-mode waveform.

Spikes on the common-mode waveform are a measure of EMI and can be observed, for example, by measuring the average value of the common-mode waveform. Strong EMI arises from unidirectional common-mode spikes, and this will cause the average value of the common-mode to deviate from that which arises when static data is transmitted. This difference can be sensed and corrected, with one possible correction means being an adjustment of the single-ended duty cycle on the half-rate clock.

Figure 25A:
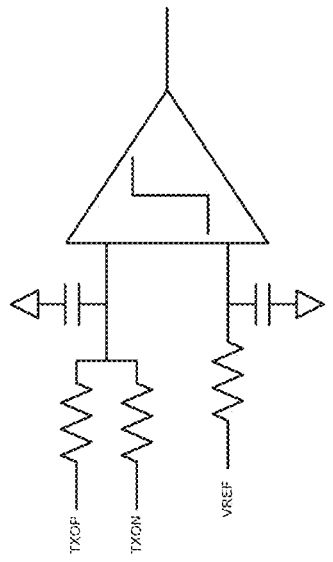
FIGS. 25A and 25B illustrate circuits for detecting EMI at the transmitter output.
Figure 25B:
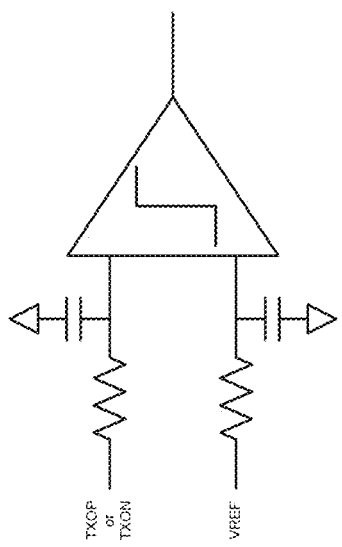

Detecting the presence of EMI at the transmitter output via on-chip means can be achieved by measuring the transmitter output common-mode and determining if it is larger or smaller than an appropriate reference voltage. This is illustrated in FIGS. 25A and 25B. The circuit illustrated in FIG. 25A infers the transmitter common mode by measuring the average of one of the transmitter output polarities. The circuit illustrated in FIG. 25B uses both polarities to measure the common mode.

Note that the presence of differential DCD on the half-rate clock may compromise the attempt to sense the presence of EMI. For example, if the differential half-rate clock has DCD, there are equal and opposite amounts of single-ended DCD on the single-ended polarities. In this case, rising and falling edges of opposing polarities will largely be lined up in time. These effects will be transferred into the data domain such that rising and falling edges of the complementary transmitter outputs will largely be lined up in time. In this case, there will be little actual EMI. However, if only one transmitter output is averaged to infer the presence of EMI, it will indicate the presence of effects analogous to single-ended DCD and suggest incorrectly that there is EMI present. Conversely, in this case averaging the superposition of the two transmitter outputs will properly infer no EMI is present. For this reason, it is prudent to ensure that some form of differential DCD correction has been applied before attempting to sense EMI. Given that this step is essential to ensure good data-dependent jitter performance anyway, it is not a consequential requirement.

A voltage mode transmitter has a common mode whose average value is typically close to one half of the supply voltage, though this will vary as a function of process, operating voltage, operating temperature, leakage, random mismatch, and circuit dynamics (e.g. overshoot or undershoot during transitions). To accommodate for this, a programmable reference voltage may be generated, for example, by a DAC.

Closed-Loop Clock Path Single-Ended DCD Adjustment for EMI Compensation

FIG. 24 and its associated description, described a closed-loop calibration approach to correcting single-ended duty cycle on the clock in a non-full-rate transmitter architecture, which can be, for example, a half-rate transmitter architecture. In the embodiment of FIG. 24, the sensor directly observed the duty cycle, and the actuator was used to adjust the duty cycle until it was corrected.

However, in other embodiments, alternate calibration approaches can be used. For example, in some embodiments, the single-ended duty cycle of the clock is actuated in an attempt to reduce EMI by directly inferring the magnitude of EMI at the transmitter output.

There are generating sources of EMI other than just transfer of single-ended DCD on the half-rate clock into the data domain. For example, rise and fall time mismatch may occur in the transmitter after the final serializer. Thus, adjusting the single-ended duty cycle of the half-rate clock to minimize EMI at the transmitter output would necessarily attempt to minimize the contribution of all such sources and could correspond to different actuator programming than the closed loop correction described in relation to FIG. 24.

As was described above, in some embodiments it is preferable to correct differential DCD in advance of the application of single-ended DCD adjustment to compensate for EMI at the transmitter output.

Closed-Loop Overview

Figure 26:
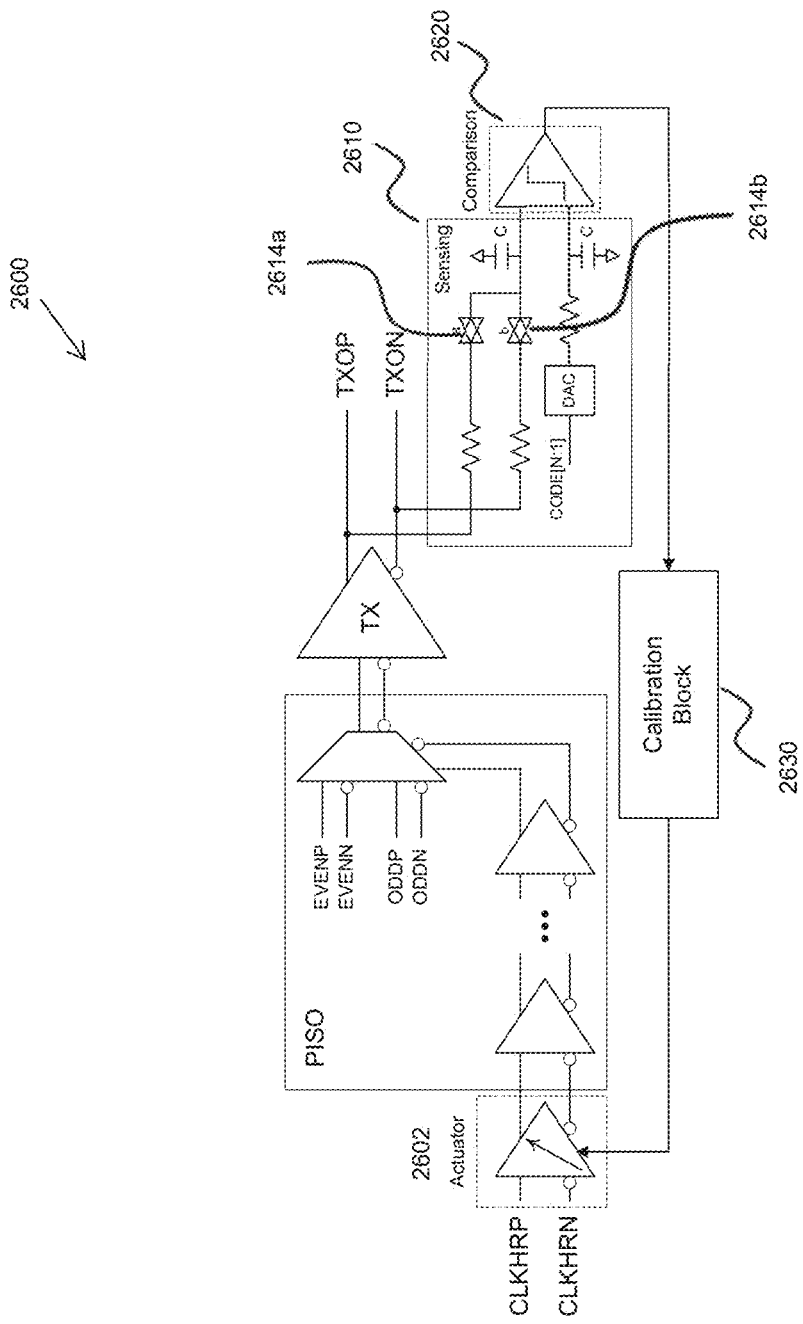
FIG. 26 illustrates a circuit for reducing EMI at the transmitter output.

A closed-loop procedure by which the single-ended DCD on the clock path can be adjusted to reduce EMI at the transmitter output is illustrated in FIG. 26. Many of the components are the same or similar to that described above: an actuator 2602 to adjust the duty cycle of the clock polarities, sensors 2610 to measure the degree of common-mode spikes at the transmitter output, one or more comparison blocks 2620, and a calibration block 2630 that determines corrective input stimulus for the actuator 2602. Elements to support differential DCD correction are not shown in the figure, but are assumed to co-exist with the implementation.

In various embodiments, actuator 2602 includes one or more of the actuators described above.

The sensor block 2610 illustrated in FIG. 26 can be configured for a number of different operations by enabling different paths to the inputs of the digitization block.

To measure the transmitter common mode from a single transmitter output polarity, transmission gate 2614a or 2614b would be enabled to select the desired polarity.

To measure the transmitter common mode from both transmitter output polarities, both transmission gates 2614a and 2614b would be enabled.

On the reference side, the reference voltage can be obtained from an N-bit programmable DAC.

In various embodiments, comparison Block 2620 is similar or the same as comparison bock 2420 described above.

Similar to the calibration block 2430 described above, the calibration block 2630 illustrated in FIG. 26 takes the output of the comparison block 2620 as its input and produces an appropriate control signal change for the actuator that serves to adjust the single-ended duty cycle of the half-rate clock and influence the average common mode level at the transmitter output.

The operation of correcting differential DCD may be considered as part of the calibration block that adjusts single-ended DCD to reduce EMI at the transmitter output, or it may be considered an independent calibration block.

Calibration Limitations and Error Sources

The sensors in the sensing block are operating on the outputs of the transmitter. Calibration may be performed when the transmitter (TX) is not in normal mode by outputting a transient signal (e.g. a clock or some other DC-balanced signal). Calibration may also be performed during normal operation using the actual transmitter output.

The principal requirement for working from transient signals is that the pattern be DC-balanced to avoid concerns regarding pattern-dependent drift in the averaging operations being performed by the sensors.

One potential source of error in performing the closed-loop calibration operation described in this section is that there may be mismatch in rise and fall time and the presence of overshoot and/or undershoot during transitions due to process variation and voltage or temperature conditions. These effects can have an influence on the sensing operation and potentially result in a systematic measurement error. Additionally, the effects of random mismatch and operational impairments in extreme process conditions and in extreme operating voltage and temperature conditions may impair the ability of the comparison block to function optimally.

Applicability to Other PISO Architectures

As described above, a PISO can be classified by the architecture employed by its final stage of serialization. Although in the example embodiments discussed thus far the focus has been on a half-rate architecture, in which the final serializer uses both edges of a half-rate clock to perform a final 2:1 serialization operation, other non-full-rate architectures are possible.

Figure 27A:
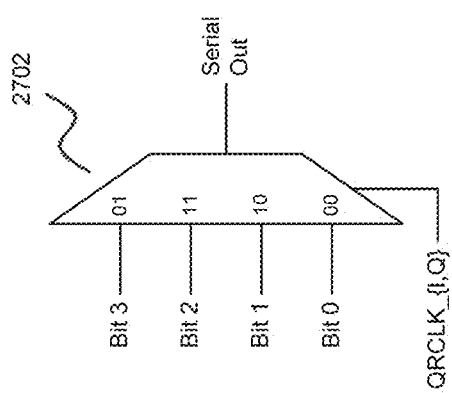
FIG. 27A illustrates a quarter-rate PISO architecture.
Figure 27B:
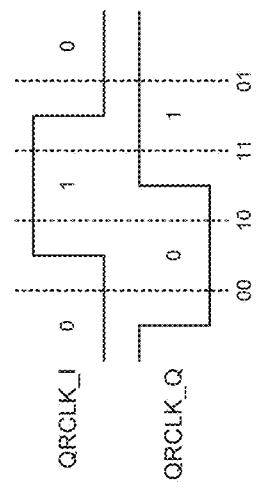
FIG. 27B illustrates quadrature-spaced clocks.

The elements of the present invention can be adapted for use with other PISO architectures. Consider, for example, a quarter-rate PISO architecture, in which the final serializer performs a 4:1 serialization operation utilizing both edges of complementary, quadrature-spaced quarter-rate clock phases. This is illustrated simplistically in FIGS. 27A and 27B. Two quadrature-spaced clocks QRCLK_I and QRCLK_Q, producing a repeated sequence of four two-bit logic values {00,10,11,01} for sets of four adjacent data-rate bit periods is illustrated. These quarter-rate clocks are then applied to a 4:1 multiplexor 2702, where the sequence of four two-bit values produced by the quarter-rate clocks result in a serialization of four quarter-rate data bits {Bit 3, Bit 2, Bit 1, Bit 0} to the serial output of the PISO. The use of two single-ended quarter-rate clocks is merely illustrative—two differential quarter-rate clocks would typically be used in a practical implementation.

Many of the considerations for preserving proper bit widths in the serialized data stream by optimizing the single-ended duty cycle and polarity skews of the phases used in the final serializer of a half-rate architecture are applicable to a quarter-rate architecture. Single-ended duty cycle considerations for each quarter-rate clock phase remain the same as described above. Ensuring a proper quadrature phase relation between the quarter-rate clock phases is also required to ensure proper bit width in the serialized output. Error in quadrature phase spacing can be detected using a strategy conceptually similar to the skew sensor described above, or by monitoring the duty cycle of the output of a logic exclusive-OR (XOR) operation on quadrature clock phases.

Further extrapolation to lower-rate PISO architectures is also possible.

Specific Application to Advance Embodiments

The previous section included discussions of variations and expansions to the ideas that were described. For purposes of clarity and readability of the disclosure, that discussion is not duplicated here.

The description of the actuator operation provided above focused on delaying the transitions of interest of clocks by starving (making weaker) the appropriate tail source(s) in the actuator. It would be equally possible to operate the actuator such that the default strength of its tail sources was not maximum strength, which would permit advancing transitions of interest (instead of just delaying them) by making the appropriate tail source(s) of the actuator stronger.

In various embodiments, there is no functional difference between the skew sensor circuits illustrated in any of FIG. 20, FIG. 21, or FIG. 22. Accordingly, in some embodiments, any of them may be used as a meaningful skew sensor. Other variations of these specific implementations are possible without modifying their ability to serve as a good skew sensor. For example the hard-tied VDD/VSS connections illustrated in FIG. 21 and FIG. 22 may be connected to control signals that can function as enable signals. It would be apparent to those skilled in the art that these sorts of cosmetic modifications do not fundamentally change the circuit operation as a skew sensor.

In the discussion above in relation to FIG. 24, it was mentioned that, in some embodiments, the correction of differential DCD was an important aspect of performing effective single-ended DCD or clock polarity skew correction, and could be performed as an independent closed-loop operation, or integrated into the closed loop operation of performing single-ended DCD or clock polarity skew correction. Differential DCD correction could also be done passively. While in some embodiments it may be a necessary requirement that differential DCD correction be performed, the specific means by which it is performed is, in many embodiments, not necessarily important.

In the discussion above in relation to FIG. 24, it was mentioned that there are a number of different ways to assemble the required elements to produce a functional closed-loop operation for single-ended DCD correction and/or polarity skew correction. For example, using one actuator versus multiple actuators, using one big sensing block and one comparison block or using multiple sensing blocks with multiple comparison blocks, or using a single comprehensive calibration block that performs multiple operations or multiple calibration blocks that each perform a single operation. There are many variations of assembling such a closed loop construct; their implementations are all different, but they may all be considered functionally equivalent overall.

In the discussion relating to FIG. 25, it was mentioned that the correction of differential DCD was an essential aspect in certain conditions for performing effective adjustment to clock path single-ended DCD to compensate for EMI at the transmitter output. However, the specific means by which differential DCD is performed is not terribly important.

In the discussion relating to FIG. 26, it was mentioned that there are a number of different ways to implement the sensing block to produce a functional closed-loop operation for adjusting the single-ended DCD of the clock path to compensate for EMI at the transmitter output. These implementations are all different, but they may all be considered functionally equivalent overall.

As previous mentioned, much of the description provided above is written in the context of a half-rate PISO/TX architecture. However, it is straightforward to extrapolate the elements of the present invention for use with other non-full rate clocks such as a quarter-rate or lower-rate PISO/TX architecture.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Various embodiments disclosed herein provide a means in half-rate transmit path architectures to correct the transfer of single-ended duty cycle distortion (DCD) from the half-rate clock into the output data domain. It also provides a means to detect and correct for skew between the positive and negative polarities of the half rate clock.

This serves to improve signal integrity characteristics on each single-ended output of a differential transmitter, and to reduce electromagnetic interference (EMI) in differential signaling applications.

Various embodiments of the disclosed methods and apparatuses for correcting clock path single-ended DCD describes a closed-loop calibration system including the actuation apparatus for the clock path, a means to sense the amount of single-ended DCD on the clock at the final stage of the serializer of the transmit path, and a calibration state machine operating on the sensor output to devise correction control inputs to the actuator to correct the single-ended DCD.

An alternate method for adjusting clock path single-ended DCD for the purposes of reducing EMI in conjunction with other methods is also described. In this alternate method, a sensing means at the output of the transmitter is used to infer the degree of EMI that is present, and a calibration state machine operates on the sensor output to devise correction control inputs to the actuator to adjust the single-ended DCD of the clock to optimize the EMI at the transmitter output.

The above-described embodiments are intended to be examples only. Alterations, modifications and variations can be effected to the particular embodiments by those of skill in the art without departing from the scope, which is defined solely by the claims appended hereto.

What is claimed is:

1. A circuit for improving signal integrity characteristics of a non-full rate transmitter, the circuit comprising:
    an actuator block having an input for receiving a differential clock signal, the differential clock signal comprising a positive clock signal and a negative clock signal, the actuator configured to adjust a difference between the positive and negative clock signals;
    a sensing block, for sensing a difference between positive and negative signals of a differential signal, the differential signal being related to the clock signal, the sensing block comprising:
        a plurality of different types of sensors; and
        at least one switch for selecting between the plurality of different types of sensors; and
    a calibration block for providing a control signal to the actuator based on the sensed difference between the positive and negative signals.

2. The circuit of claim 1, wherein the differential signal comprises a differential clock signal.

3. The circuit of claim 2, wherein the sensing block comprises a clock skew sensor.

4. The circuit of claim 2, wherein the circuit is configured to correct clock polarity skew.

5. The circuit of claim 1, wherein the differential signal comprises a differential output signal of the non-full rate transmitter.

6. The circuit of claim 5, wherein the circuit is configured to reduce EMI.

7. The circuit of claim 1, further comprising a comparison block configured to:
    digitize the sensed difference between the adjusted positive and negative signals; and provide the digitized sensed difference to the calibration block.

8. The circuit of claim 1, wherein the sensing block comprises a single ended duty cycle distortion (DCD) sensor.

9. The circuit of claim 1, wherein the sensing block comprises an RC filter.

10. The circuit of claim 1, wherein the sensing block comprises a DCD-free clock generator.

11. The circuit of claim 1, wherein the actuator block is configured to delay transitions of at least one of the positive signal and the negative signal.

12. The circuit of claim 1, wherein the actuator block is configured to advance transitions of at least one of the positive signal and the negative signal.

13. The circuit of claim 1, wherein the actuator block comprises an actuator having a current starved inverter.

14. The circuit of claim 13, wherein the actuator block comprises a plurality of parallel current starved inverters.

15. The circuit of claim 13, wherein the current starved inverter comprises an input for receiving an analog control signal.

16. The circuit of claim 13, wherein the current starved inverter comprises an input for receiving a digital control signal.

17. The circuit of claim 1, wherein the circuit is configured to correct differential DCD.

18. The circuit of claim 1, wherein the circuit is configured to correct single-ended DCD.

19. The circuit of claim 1, wherein the non-full rate transmitter comprises a half rate transmitter.

20. The circuit of claim 1, wherein the non-full rate transmitter comprises a quarter rate transmitter.

* * * * *